(12) United States Patent
Egawa et al.

(10) Patent No.: US 7,757,752 B2
(45) Date of Patent: Jul. 20, 2010

(54) HEAT EXCHANGER, LIGHT SOURCE APPARATUS, AND PROJECTOR

(75) Inventors: Akira Egawa, Shiojiri (JP); Kunihiko Takagi, Okaya (JP); Koichi Saito, Matsumoto (JP); Kenji Matsuyama, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 76 days.

(21) Appl. No.: 11/797,837

(22) Filed: May 8, 2007

(65) Prior Publication Data
US 2007/0261830 A1 Nov. 15, 2007

(30) Foreign Application Priority Data
May 12, 2006 (JP) ............................. 2006-133602
May 12, 2006 (JP) ............................. 2006-133603

(51) Int. Cl.
*F28F 3/06* (2006.01)
(52) U.S. Cl. ...................................... 165/170; 165/80.4
(58) Field of Classification Search ................ 165/80.4, 165/80.5, 170
See application file for complete search history.

(56) References Cited

U.S. PATENT DOCUMENTS

| | | | | |
|---|---|---|---|---|
| 3,327,776 A | * | 6/1967 | Butt | ........................... 165/80.4 |
| 6,563,709 B2 | * | 5/2003 | Negishi et al. | ............. 165/80.4 |
| 7,309,145 B2 | | 12/2007 | Nagata et al. | |
| 2002/0185260 A1 | * | 12/2002 | Calaman et al. | ............ 165/80.4 |
| 2004/0032665 A1 | * | 2/2004 | Fujimori et al. | ............. 359/634 |
| 2004/0256092 A1 | * | 12/2004 | Winslow et al. | ............ 165/80.4 |

FOREIGN PATENT DOCUMENTS

| | | |
|---|---|---|
| JP | U-58-194452 | 12/1983 |
| JP | A-6-24279 | 2/1994 |
| JP | U-3010080 | 2/1995 |
| JP | A-8-204074 | 8/1996 |
| JP | A-2002-039502 | 2/2002 |
| JP | A 2005-085887 | 3/2005 |
| JP | A 2005-202112 | 7/2005 |
| JP | 2005-229095 | 8/2005 |
| JP | A 2006-247828 | 9/2006 |

* cited by examiner

*Primary Examiner*—Teresa J Walberg
(74) *Attorney, Agent, or Firm*—Oliff & Berridge, PLC

(57) ABSTRACT

A heat exchanger includes a corrugated plate that has a corrugation; a fluid-flux portion that stores the corrugated plate, and makes a fluid flow; a first structure that constitutes the fluid-flux portion; and a second structure that constitutes the fluid-flux portion, and is provided on a heat source side with respect to the first structure, wherein at least a portion constituting the fluid-flux portion in the second structure has a flat plate shape. The flat plate shape of the portion constituting the fluid-flux portion in the second structure enables easy manufacturing of the heat exchanger. The flat plate shape in the second structure further enables a close contact of the fluid-flux portion to the heat source, resulting in a heat exchange with high efficiency.

16 Claims, 19 Drawing Sheets

HEAT EXCHANGER, LIGHT SOURCE APPARATUS, AND PROJECTOR

BACKGROUND OF THE INVENTION

1. Field of the Invention

The present invention relates to a heat exchanger, a light source apparatus, and a projector, specifically to a technology of a heat exchanger suitable for a light source apparatus of a projector.

2. Description of the Related Art

A solid-state light source, specifically a light-emitting diode element which is referred to as "LED" hereinbelow is expected to be used for a light source apparatus of a compact projector because of its characteristics such as compact size, capability of instant blinking and lighting, high color purity, long life, and the like. Since most electrical current fed to the LED is converted to heat, the LED with higher intensity causes deterioration in light-emission efficiency due to an increase in calorific power. Therefore, it is desired to enhance a heat-radiation efficiency to improve the light-emission efficiency of the LED. Since the known air system using a fan is not sufficient enough to enhance the heat-radiation efficiency of the LED, a technology in which the LED is cooled by making a refrigerant flow has been proposed. Since the LED has high heating density, it is desirable to make the refrigerant flow at as close position to a heat source as possible. Furthermore, a configuration of making the refrigerant flow through multiple fine channels, each of which is several micrometers to several hundred micrometers in width, enables an increase in the contact area between the refrigerant and the channel wall, resulting in an efficient heat exchange. Typically, the fine channel can be formed by etching or wire-electric-discharge machining. However, since the etching or wire-electric-discharge machining requires high cost as well as long time, it is desirable that the fine channel is formed in any easier machining from the standpoint of mass-producing the heat exchanger. JP-A-2005-85887, for example, proposes a technology for forming a plurality of fine channels in an easy machining at low cost.

JP-A-2005-85887 discloses a configuration of a cooling plate in which a corrugated fin as a corrugated plate member is surrounded by an incrustation plate. The incrustation plate is formed by jointing two shaped plates. For an efficient heat exchange, it is desirable that a particular portion, which is in contact with the heat source, of the incrustation plate is formed to be as flat as possible to enable the heat source to closely contact the cooling plate. However, when the incrustation plate is formed by using a plate, it is difficult to realize the flatness since the center portion of the plate as the portion in contact with the heart source tends to warp. The warp of the incrustation plate requires additional process of forming the flatness of the portion in contact with the heat source, which increases man-hour necessary for manufacturing the heat exchanger. Moreover, forming of the incrustation plate requires shaping process for both of the two plates, which leads to a difficulty in reducing man-hour.

Besides, when there presents fluctuation in the distance between the incrustation plate and a fold of the corrugated fin on the heat source side, a clearance may arise between the fold and the incrustation plate. Since the efficiency of the heat exchange deteriorates if the contact between the fold and the incrustation plate is insufficient, such clearance is filled with a heat-conductive adhesive or a wax material. However since the thermal conductivity of the heat-conductive adhesive and the wax material is poorer than that of copper or aluminum forming the corrugated fin, thicker filling of the heat-conductive adhesive or the wax material degrades the performance of the heat exchanger. To eliminate the fluctuation in the distance between the incrustation plate and the fold of the corrugated fin, it is desirable to arrange the fold in line to have the same height at the stage of manufacturing the corrugated fin. Conventionally, a press work using a gear roll is employed for forming the corrugated fin, for example. In such a press work, it is very difficult to form the fold in line to have the same height with a high degree of accuracy. To realize high heat-exchange efficiency, it is desired to form as many fine channels as possible so that the contact area between a fluid and the channel wall increases. To form many fine channels for the compact heat source, it is necessary to form the corrugated fin whose corrugated pitch is made to be as small as possible. As a curve of the fold of the corrugated fin becomes smaller, the rigidity of the fold increases, and thereby it becomes difficult to implement an additional machining for arranging the fold in line to have the same height. For example, it is possible to improve the heat-exchange efficiency with a configuration that the fold is fixed to the incrustation plate to keep the distance of the corrugation. In this case, the manufacturing cost soars since it is necessary to implement a process for fixing the fold to the two members constituting the incrustation plate, and the corrugated fin may be deformed due to a compression force imposed by the two members to the corrugated fin. When the corrugated fin is deformed, the flow of the refrigerant becomes uneven due to the deformation of the fine channel, which leads to a difficulty in the efficient heat exchange.

SUMMARY

As described, the related art raises a problem that it is difficult to allow an easy manufacturing and to perform a heat exchange with high efficiency. It is an object of the invention to provide a heat exchanger capable of a heat exchange with high efficiency, a light source apparatus using the same, and a projector.

To solve the problems and achieve the object, the heat exchanger according to one aspect of the invention includes a first structure and a second structure that form a fluid-flux portion for making a fluid flow; and a corrugated plate stored in the fluid-flux portion. The second structure is provided on a heat source side with respect to the first structure and has a flat portion facing the fluid-flux portion.

By storing the corrugated plate in the fluid-flux portion formed by the first structure and the second structure, a plurality of fine channels are formed in the fluid-flux portion. With the fine channels, the heat exchanger can have an increased contact area between the fluid and the channel wall, and thereby obtaining an efficient heat exchange. By forming the portion constituting the fluid-flux portion to have the flat plate shape, the second structure can be formed easily by cutting out a flat plate, for example. Therefore, no complicated process is necessary for the second structure, and the fluid-flux portion can be formed by implementing a process mainly on the first structure. Consequently, man-hour for manufacturing the heat exchanger can be reduced. By making at least the portion forming the fluid-flux portion the flat plate shape in the second structure, the fluid-flux portion of the heat exchanger can closely contact the heat source, and the heat exchanger can perform an efficient heat exchange. Accordingly, the heat exchanger which can be manufactured easily and perform an efficient heat exchange is obtained.

In the heat exchanger according to the invention, the first structure may include a concave portion which is formed to store the corrugated plate therein. The first structure has a concave portion whose depth is substantially the same as the height of the corrugated plate so that the concave portion can store the corrugated plate. The fluid-flux portion can be formed by jointing the concave portion of the first structure and the flat shape portion of the second structure with the corrugated plate stored in the concave portion of the first structure. The first structure including the concave portion can be formed easily via a drawing and the like. Accordingly, the heat exchanger including the fluid-flux portion can be manufactured easily by using the second structure having the flat plate shape.

In the heat exchanger according to the invention, the first structure may include an inflow portion which makes the fluid flow into the fluid-flux portion, and an outflow portion which makes the fluid flow out of the fluid-flux portion. The configuration of having the inflow portion and the outflow portion enables the heat exchanger to be connected easily to a circulation unit which circulates the fluid. The inflow portion and the outflow portion can be formed at the same time as the drawing for forming the concave portion. By forming the inflow portion and the outflow portion together with the concave portion, an additional work only for forming the inflow portion and the outflow portion can be eliminated. The elimination of such an additional work allows reducing the man-hour and the manufacturing cost.

In the heat exchanger according to the invention, the corrugated plate may be disposed in the middle of a part connected to the inflow portion and a part connected to the outflow portion in the fluid-flux portion. By arranging the corrugated plate between the inflow portion and the outflow portion, a space can be formed in the part connected to the inflow portion, and the part connected to the outflow portion each in the fluid-flux portion. With such a space in each of the part connected to the inflow portion and the part connected to the outflow portion in the fluid-flux portion, the refrigerant can flow evenly to each fine channel in the fluid-flux portion. Accordingly, the heat exchange can be performed evenly and efficiently.

In the heat exchanger according to the invention, the first structure may include a notch portion which is formed to allow the corrugated plate on the first structure side to fit therein. The fluid-flux portion is formed in a state that the corrugated plate fits in the notch portion, so that the corrugated plate can be positioned accurately. The fitting of the corrugated plate into the notch portion allows fixing the corrugated plate at a position corresponding to the heat source in the fluid-flux portion, without locking the corrugated plate to the second structure. The notch portions can be formed at the same time as the forming of the first structure via the drawing and the like. Thus, the heat exchanger in which the corrugated plate is positioned at a right place can be manufactured easily.

In the heat exchanger according to the invention, the second structure and the corrugated plate may be jointed via brazing, so that the heat from the heat source can be transmitted to the fluid efficiently.

In the heat exchanger according to the invention, the first structure and the second structure may be jointed via brazing, so that the heat exchanger capable of preventing a leakage of the fluid can be obtained.

The heat exchanger according to the invention may further include a caulking portion that joints the first structure and the second structure by caulking. Since the first structure and the second structure are jointed via a plastic deformation at the caulking portion, the entirety of the fluid-flux portion can be formed only by a process for implementing the plastic deformation on the member. Since the process such as brazing is not required in the forming of the fluid-flux portion, the manufacturing cost for the heat exchanger can be reduced and the heat exchanger can be manufactured in an easy way. Accordingly, the heat exchanger which can be manufactured in an easy way at a reduced manufacturing cost is obtained.

The heat exchanger according to the invention may further include a sealing member that seals the first structure and the second structure at the caulking portion. The sealing member can prevent the fluid from leaking out of the joint between the first structure and the second structure in the fluid-flux portion.

The heat exchanger according to the invention may further include a pressing member, wherein the corrugated plate may include a first fold formed on the first structure side and a second fold formed on the second structure side, and the pressing member may be provided between the first fold and the first structure, and make the second fold press against the second structure. The heat exchanger with a simple configuration using the pressing member allows the second fold of the corrugate plate to contact the second structure on the heat source side with respect to the fluid-flux portion securely and directly. The secure and direct contact of the second fold to the second structure enables the heat exchanger to transmit the heat from the heat source efficiently to the corrugated plate, and to perform the heat exchange with high efficiency. Furthermore, no necessity for the additional process for arranging the fold in line to have the same height, and a process for jointing the corrugated plate to the second structure allows manufacturing the heat exchanger with small man-hour.

The heat exchanger according to the invention may further include a press-deformation portion that is formed by making at least a portion corresponding to the corrugated plate in the first structure deformed accordingly while the corrugated plate is depressed. The press-deformation portion can be, for example, obtained by forming the portion corresponding to the corrugated plate in the first structure which is made of a metal member and the vicinity thereof thinly enough to be deformable. The press-deformation portion pushes back the corrugated plate to the second structure side due to a restoring force against the pressing of the corrugated plate. In this way, the corrugated plate can securely and directly contact the second structure in the heat exchanger. Accordingly, the heat exchanger can transmit the heat from the heat source efficiently to the corrugated plate, and thereby the heat exchange with high efficiency can be performed. Furthermore, no necessity for the additional process for arranging the fold in line to have the same height, and the process for jointing the corrugated plate to the second structure allows manufacturing the heat exchanger with small man-hour.

A heat exchanger according to another aspect of the invention includes a first structure and a second structure that form a fluid-flux portion for making a fluid flow; and a corrugated plate stored in the fluid-flux portion. The second structure is provided on a heat source side with respect to the first structure and has a groove corresponding to a portion, of the corrugated plate, at a second structure side.

By storing the corrugated plate in the fluid-flux portion formed by the first structure and the second structure, a plurality of fine channels are formed in the fluid-flux portion. With the fine channels, the heat exchanger can have an increased contact area between the fluid and the channel wall, and thereby obtaining an efficient heat exchange. With the groove formed on the second structure, the corrugated plate on the second structure side can fit in the groove, so that the corrugated plate can securely and directly contact the second structure. By making the corrugated plate securely and directly contact the second structure, the heat exchanger can transmit the heat from the heat source efficiently to the corrugated plate and perform the heat exchange with high efficiency. Since the corrugated plate can fit in the groove and the corrugated plate can be fixed in the fluid-flux portion, a compression force by the first structure and the second structure is not necessary, and thereby preventing a deformation of the corrugated plate. Furthermore, it is also possible to eliminate the additional work for arranging the fold in line to have the same height, and the process for jointing the second structure and the corrugated plate. Thus, the heat exchanger which can perform the heat exchange with high efficiency and be manufactured easily is obtained.

In the heat exchanger according to the invention, the groove may be formed to allow the corrugated plate on the second structure side to fit therein via an interference fit. The interference fit indicates a fitting having an interference. The groove is formed to have a width smaller than an outside diameter of the fold of the corrugated plate. The fitting of the corrugated plate into the groove via the interference fit allows a direct and secure contact of the corrugated plate to the second structure, and further allows a secure fixation of the corrugated plate in the fluid-flux portion.

In the heat exchanger according to the invention, the corrugated plate may include a fold formed on the second structure side, and a length in a depth direction of the groove is longer than a bending radius of an outer circumference of the fold and shorter than a double of the bending radius. By setting the length in the depth direction of the groove to be longer than the bending radius of the outer circumference of the fold, the corrugated plate on the second structure side can securely and directly contact the wall of the groove even with the fluctuation in the height of the fold on the second structure side. Accordingly, the contact area between the corrugated plate and the wall of the groove can be secured sufficiently, and the heat from the heat source can be transmitted to the corrugated plate efficiently. The corrugated plate except for the portion fitting in the groove forms the fine channel. By setting the length in the depth direction of the groove to be shorter than the double of the bending radius of the outer circumference, the contact area between the fluid and the channel wall can secured sufficiently. The above setting also allows securing the thickness of the second structure, and thereby it is possible to secure the strength of the second structure as well as to reduce the degradation of the heat-transmission efficiency in the second structure. By limiting the depth of the groove, the heat exchange can be performed with higher efficiency, and the strength of the second structure can be secured.

The heat exchanger according to the invention may further include a filling member that is provided between the first structure and the corrugated plate. The filling member reduces the amount of the fluid leaking into the clearance between the first structure and the corrugated plate, and thereby increasing the fluid flowing through the fine channel. The increase of the fluid in the fine channel can allow the heat exchange with still higher efficiency.

The heat exchanger according to the invention may further include a caulking portion that joints the first structure and the second structure by caulking. Since the first structure and the second structure are jointed via a plastic deformation at the caulking portion, the entirety of the fluid-flux portion can be formed only by a process for implementing the plastic deformation on the member. Since the process such as brazing is not required in the forming of the fluid-flux portion, the manufacturing cost for the heat exchanger can be reduced and the heat exchanger can be manufactured in an easy way.

Accordingly, the heat exchanger which can be manufactured in an easy way at a reduced manufacturing cost is obtained.

The heat exchanger according to the invention may further include a sealing member that seals the first structure and the second structure at the caulking portion. The sealing member can prevent the fluid from leaking out of the joint between the first structure and the second structure in the fluid-flux portion.

The heat exchanger according to the invention may further include a pressing member, wherein the corrugated plate may include a first fold formed on the first structure side and a second fold formed on the second structure side, and the pressing member may be provided between the first fold and the first structure, and make the second fold press against the second structure. The heat exchanger with a simple configuration using the pressing member allows the second fold of the corrugate plate to contact the second structure on the heat source side with respect to the fluid-flux portion securely and directly. The secure and direct contact of the second fold to the second structure enables the heat exchanger to transmit the heat from the heat source efficiently to the corrugated plate, and to perform the heat exchange with high efficiency. Furthermore, no necessity for the additional process for arranging the fold in line to have the same height, and a process for jointing the corrugated plate to the second structure allows manufacturing the heat exchanger with small man-hour.

The heat exchanger according to the invention may further include a press-deformation portion that is formed by making at least a portion corresponding to the corrugated plate in the first structure deformed accordingly while the corrugated plate is depressed. The press-deformation portion can be, for example, obtained by forming the portion corresponding to the corrugated plate in the first structure which is made of a metal member and the vicinity thereof thinly enough to be deformable. The press-deformation portion pushes back the corrugated plate to the second structure side due to a restoring force against the pressing of the corrugated plate. In this way, the corrugated plate can securely and directly contact the second structure in the heat exchanger. Accordingly, the heat exchanger can transmit the heat from the heat source efficiently to the corrugated plate, and thereby the heat exchange with high efficiency can be performed. Furthermore, no necessity for the additional process for arranging the fold in line to have the same height, and the process for jointing the corrugated plate to the second structure allows manufacturing the heat exchanger with small man-hour.

A light source apparatus according to still another aspect of the invention includes a light source unit that supplies a light; and a heat exchanger that radiates a heat of the light source unit. The heat exchanger includes a first structure and a second structure that form a fluid-flux portion for making a fluid flow; and a corrugated plate stored in the fluid-flux portion. The second structure is provided on a heat source side with respect to the first structure and has a flat portion facing the fluid-flux portion.

The light source apparatus can be manufactured easily and perform the heat exchange with high efficiency by using the heat exchanger according to the invention. The heat exchange with high efficiency allows the light source apparatus to increase the electricity to be fed thereto, and supply a brighter light.

A light source apparatus according to still another aspect of the invention includes a light source unit that supplies a light; and a heat exchanger that radiates a heat of the light source unit. The heat exchanger includes a first structure and a second structure that form a fluid-flux portion for making a fluid flow; and a corrugated plate stored in the fluid-flux portion. The second structure is provided on a heat source side with respect to the first structure and has a groove corresponding to a portion, of the corrugated plate, at a second structure side.

The light source apparatus can be manufactured easily and perform the heat exchange with high efficiency by using the heat exchanger according to the invention. The heat exchange with high efficiency allows the light source apparatus to increase the electricity to be fed thereto, and supply a brighter light.

A projector according to still another aspect of the invention includes a light source apparatus that includes a light source unit which supplies a light, and a heat exchanger which radiates a heat of the light source unit. The heat exchanger includes a first structure and a second structure that form a fluid-flux portion for making a fluid flow; and a corrugated plate stored in the fluid-flux portion. The second structure is provided on a heat source side with respect to the first structure and has a flat portion facing the fluid-flux portion.

The projector can be manufactured easily and project a clear image with a blight light by using the light source apparatus according to the invention. Thus, the projector capable of an easy manufacturing and projecting a clear image can be obtained.

A projector according to still another aspect of the invention includes a light source apparatus that includes a light source unit which supplies a light, and a heat exchanger which radiates a heat of the light source unit. The heat exchanger includes a first structure and a second structure that form a fluid-flux portion for making a fluid flow; and a corrugated plate stored in the fluid-flux portion. The second structure is provided on a heat source side with respect to the first structure and has a groove corresponding to a portion, of the corrugated plate, at a second structure side.

The projector can be manufactured easily and project a clear image with a blight light by using the light source apparatus according to the invention. Thus, the projector capable of an easy manufacturing and projecting a clear image can be obtained.

DETAILED DESCRIPTION OF THE PREFERRED EMBODIMENTS

Exemplary embodiments of the invention will be explained in detail below with reference to the accompanying drawings.

Figure 1:
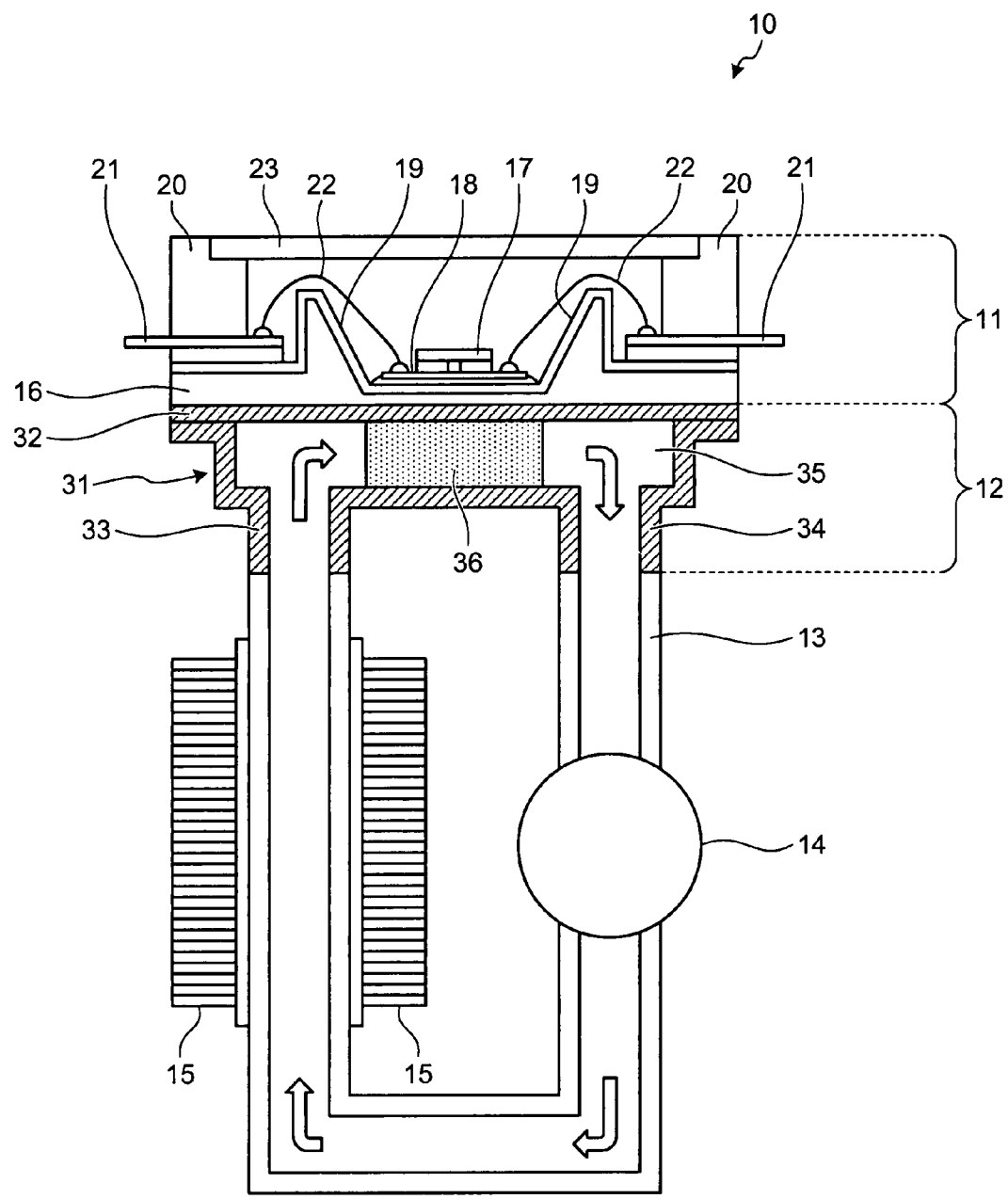
FIG. 1 illustrates a schematic configuration of a light source apparatus according to a first embodiment of the invention.

FIG. 1 illustrates a schematic configuration of a light source apparatus 10 according to a first embodiment of the invention. The light source apparatus 10 includes a light source unit 11 that supplies light. The light source apparatus 10 performs a heat radiation of the light source unit 11 by using a heat exchanger 12. The heat exchanger 12 is provided on a side opposite to a light emission side of the light source unit 11. The heat exchanger 12 propagates the heat from the light source unit 11 to a refrigerant, and thereby radiates the heat of the light source unit 11.

Figure 2:
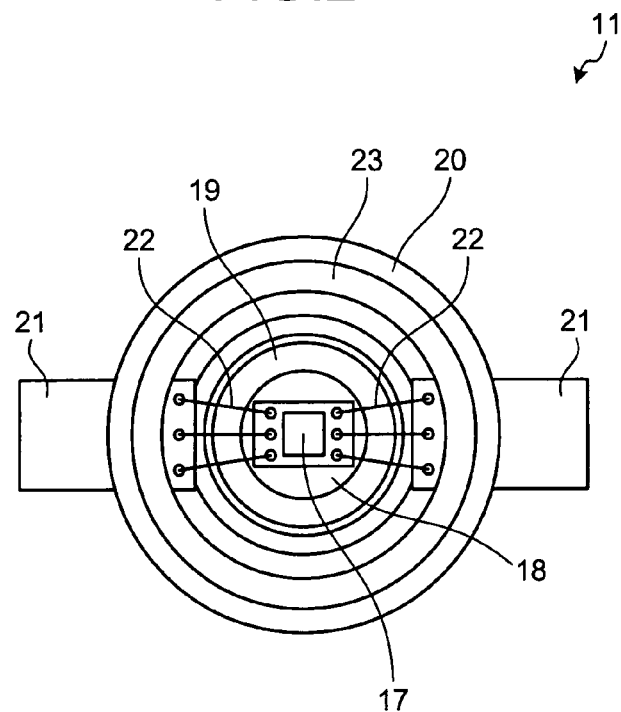
FIG. 2 is a top view of a configuration of a light source unit.

FIG. 2 is a top view of a configuration of the light source unit 10. An LED chip 17 as a solid-state light source is a vertical-cavity-surface-emitting light source which mainly emits light from an upper surface thereof. The LED chip 17 has a substantially-square shape. The LED chip 17 is mounted on a sub-mount 18 via flip-chip mounting. With reference to FIG. 1 again, the LED chip 17 is mounted on a base 16 together with the sub-mount 18. The sub-mount 18 is fixed on the base 16 by a heat-conductive adhesive such as a silver paste. A reflector 19 is formed to surround the LED chip 17 on the upper surface of the base 16. The reflector 19 reflects a light from the LED chip 17. A resin frame 20 is formed to surround the reflector 19. A cap 23 is provided to cover a space which is surrounded by the resin frame 20. The space surrounded by the cap 23 and the resin frame 20 is filled with silicon oil and the like.

The resin frame 20 is molded with an outer reed 21 via an insert-mold technique in which the resin frame 20 is molded in a state that the outer reed 21 is inserted in the mold. One end of the outer reed 21 is connected to a metal wire 22. The other side, i.e., the side opposite to the side to which the metal wire 22 is connected, of the outer reed 21 is connected a flexible board which is not shown. The outer reed 21 is connected to a connection pad formed on the sub-mount 18 via the metal wire 22. The LED chip 17 is supplied with electric current via the flexible board, the outer reed 21, and the metal wire 22.

The LED chip 17 supplied with electric current emits light. The light from the LED chip 17 enters the cap 23 directly or after being reflected by the reflector 19. The cap 23 transmits the light from the LED chip 17. Though FIG. 2 shows a configuration where three metal wires 22 are connected to the outer reed 21, the number of the metal wire 22 can be changed arbitrarily according to the electric energy to be fed to the LED chip 17.

The heat exchanger 12 includes a first structure 31 and a second structure 32. The second structure 32 is provided on a side of the LED chip 17 as the heat source with respect to the first structure 31. The first structure 31 and the second structure 32 are formed by using a copper material, for example. The second structure 32 and the light source unit 11 are fixed to each other by a screw and the like, heat-conductive grease intervening therebetween. A fluid-flux portion 35 composed of the first structure 31 and the second structure 32 allows the refrigerant as a fluid to flow.

The fluid-flux portion 35 is disposed to correspond to a position where the LED chip 17 of the light source unit 11 is located. The fluid-flux portion 35 stores a corrugated plate 36. The corrugated plate 36 is sandwiched between the first structure 31 and the second structure 32 in the fluid-flux portion 35. The first structure 31 includes an inflow portion 33 and an outflow portion 34. The inflow portion 33 makes the refrigerant flow into the fluid-flux portion 35. The outflow portion 34 makes the refrigerant flow out of the fluid-flux portion 35. With such a configuration having the inflow portion 33 and the outflow portion 34, the heat exchanger 12 can be connected easily to a circulation unit 13.

The circulation unit 13 forms a channel which circulates the refrigerant as a fluid. The circulation unit 13 is connected to the inflow portion 33 and the outflow portion 34. The circulation unit 13 is provided with a circulation pump 14 and a heat-radiation fin 15. The circulation pump 14 circulates the refrigerant in the circulation unit 13 and the fluid-flux portion 35 as shown with an arrow in FIG. 1. The heat-radiation fin 15 radiates the heat of the refrigerant to the outside. The light source apparatus 10 can continue supplying the fluid-flux portion 35 with the refrigerant after its heat is radiated in the heat-radiation fin 15. The heat-radiation fin 15 is formed by a member having excellent thermal conductivity, for example a metal member such as iron, copper, aluminum, and the like, or a member made of mixed metal materials. An air-cooling fan for expediting heat radiation of the heat-radiation fin 15 may be provided additionally to the configuration. With such a configuration, the light source apparatus 10 radiates the heat from the LED chip 17 to the outside via the refrigerant.

The positions of the circulation pump 14 and the heat-radiation fin 15, and the direction of circulating the refrigerant in the circulation unit 13 are not limited to those shown in FIG. 1. The refrigerant is selected from fluids of noncorrosive nature with respect to any member constituting the light source apparatus 10. The refrigerant is desired to be a fluid having low steam pressure, low coagulation point, excellent thermal stability, and high thermal conductivity. In consideration of such a requirement, the refrigerant may be, for example, a fluid of propylene glycol series, biphenyl-diphenyl ether series, alkyl benzene series, alkyl biphenyl series, triaryl dimethane series, alkyl naphthalene series, hydrogenated terphenyl series, diaryl alkane series, silicon series, and fluorine series.

Figure 3:
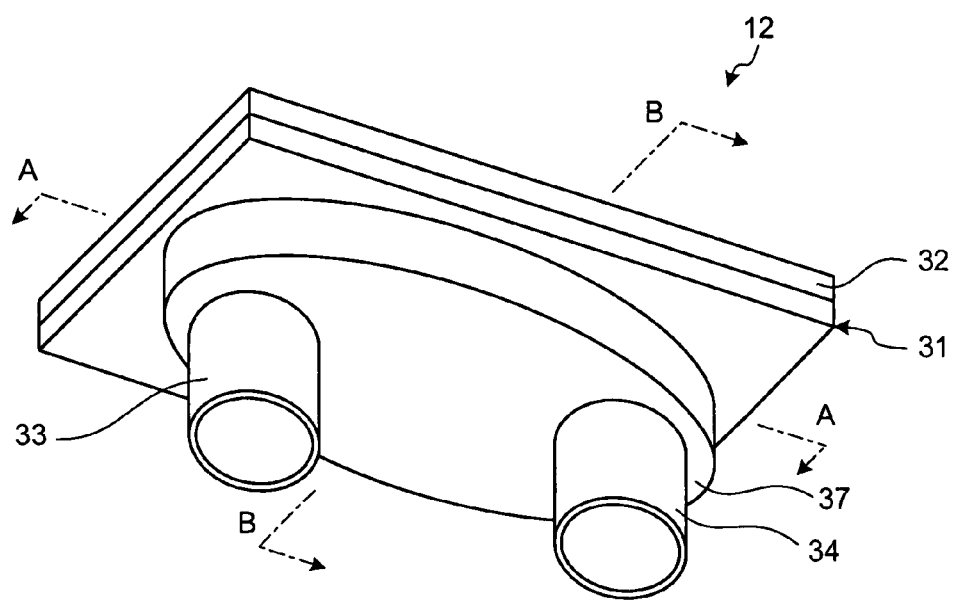
FIG. 3 is a perspective view of a configuration of a heat exchanger.
Figure 4:
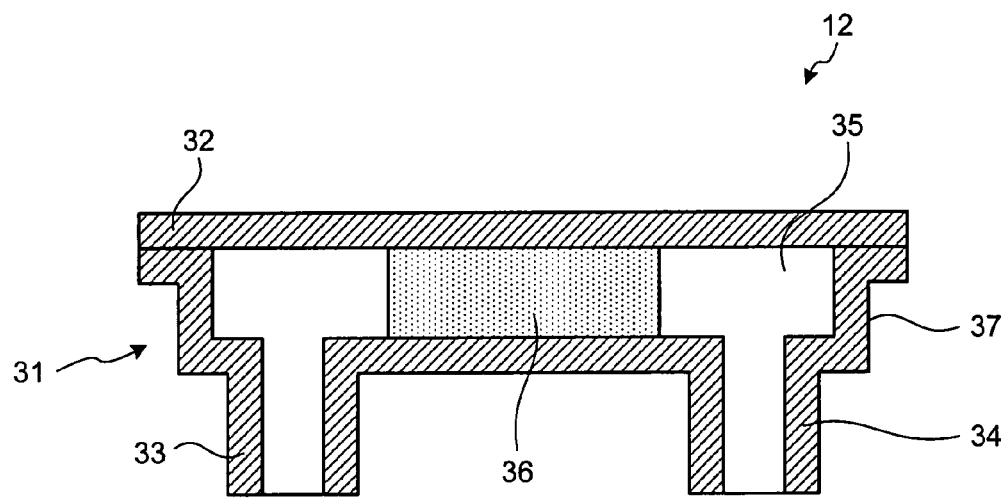
FIG. 4 is a cross sectional view of the configuration shown in FIG. 3 along the line A-A.

FIG. 3 is a perspective view of the configuration of the heat exchanger 12. FIG. 4 is a cross sectional view of the configuration shown in FIG. 3 along the line A-A. The first structure 31 has a concave portion 37. The first structure 31 stores the corrugated plate 36 in the concave portion 37 whose depth is substantially the same as the height of the corrugated plate 36. The second structure 32 has a flat plate shape. The fluid-flux portion 35 is formed by jointing the concave portion 37 of the first structure 31 and the second structure 32 having a flat plate shape together. The first structure 31 and the second structure 32 are jointed with each other in the circumference of the fluid-flux portion 35. The first structure 31 and the second structure 32 are jointed by brazing, welding, and the like so that a leakage of the refrigerant from the joint of the first structure 31 and the second structure 32 can be prevented. The shape of the first structure 31 may be changed arbitrarily as long as the corrugated plate 36 can be stored in the concave portion 37.

Figure 5:
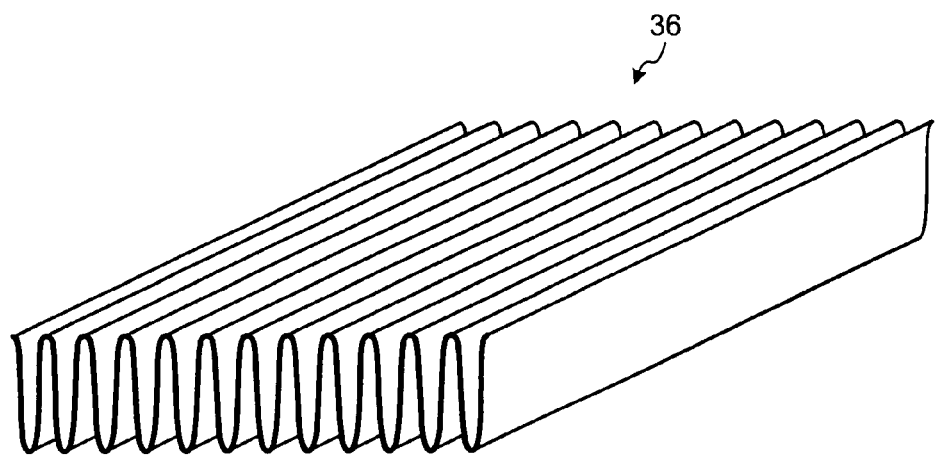
FIG. 5 illustrates a shape of a corrugated plate.

As shown in FIG. 5, the corrugated plate 36 has a corrugation which is formed by alternate mountain fold and valley fold of the plate member. The corrugated plate 36 can be formed by a press work using a gear roll, for example. The corrugated plate 36 has a thickness of 50 micrometers to 150 micrometers, for example. The corrugated plate 36 is formed with the copper material similarly to the first structure 31 and the second structure 32, for example. The copper material constituting the first structure 31, the second structure 32, and the corrugated plate 36 has excellent thermal conductivity and high processability. By forming the first structure 31, the second structure 32, and the corrugated plate 36 with the copper material, the heat exchanger 12 can be configured to have excellent thermal conductivity and processability. To prevent the leakage of the refrigerant from the heat exchanger 12, a corrosion potential may be additionally provided so that the corrugated plate 36 corrodes preferentially to the first structure 31 and the second structure 32. By adding zinc to the corrugated plate 36 for example, the corrosion potential to cause such a preferential corrosion of the corrugated plate 36 can be provided.

Figure 6:
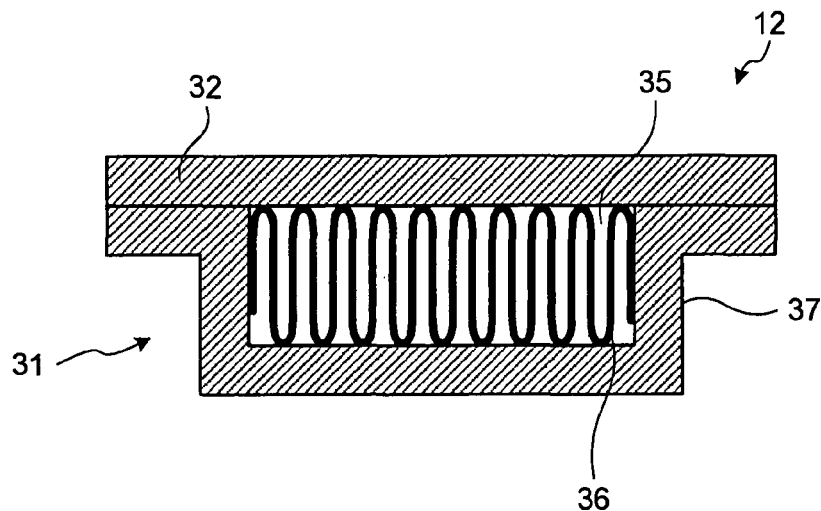
FIG. 6 is a cross sectional view of the configuration shown in FIG. 3 along the line B-B.

FIG. 6 is a cross sectional view of the configuration shown in FIG. 3 along the line B-B. By storing the corrugated plate 36 in the fluid-flux portion 35 formed by the first structure 31 and the second structure 32, a plurality of fine channels are formed in the fluid-flux portion 35. Each fine channel is formed to have a width of several dozen micrometers to several hundred micrometers. The heat from the LED chip 17 shown in FIG. 1 is transmitted to the refrigerant passing through the fine channels via the second structure 32 and the corrugated plate 36. Thus, the heat exchanger 12 radiates the heat of the light source unit 11 provided on the side of the second structure 32 with respect to the fluid-flux portion 35. With the fine channels formed in the fluid-flux portion 35, the heat exchanger 12 can have an increased contact area between the refrigerant and the channel wall, and thereby obtaining an efficient heat exchange. The heat exchanger 12 has the fine channels arranged in line in a space which substantially has a cross section of a rectangle shape. Consequently, the heat exchanger 12 can make the refrigerant flow evenly to each fine channel in the fluid-flux portion 35.

With reference to FIG. 4 again, the corrugated plate 36 is disposed in the middle of a part connected to the inflow portion 33 and a part connected to the outflow portion 34 of the fluid-flux portion 35. By arranging the corrugated plate 36 between the inflow portion 33 and the outflow portion 34, a space can be formed in the part connected to the inflow portion 33, and the part connected to the outflow portion 34 of the fluid-flux portion 35. With such a space in the part connected to the inflow portion 33 and the part connected to the outflow portion 34 of the fluid-flux portion 35, it is possible to make the refrigerant flow evenly to each fine channel in the fluid-flux portion 35.

The corrugated plate 36 and the second structure 32 are jointed by brazing or bonding using the heat-conductive adhesive and the like. By jointing the light source unit 11 of FIG. 1, the second structure 32, and the corrugated plate 36 by using a heat-conductive material, it becomes possible to transmit the heat from the LED chip 17 as the heat source efficiently to the refrigerant. The light source unit 11, the second structure 32, and the corrugated plate 36 are not limited to the configuration of being adhered with each other, as long as the heat can be transmitted efficiently. For example, only the light source unit 11 and the second structure 32 may be in contact with each other, or only the second structure 32 and the corrugated plate 36 may be in contact with each other. In this case, since it is not necessary to prepare a process of jointing the light source unit 11 and the second structure 32, or jointing the second structure 32 and the corrugated plate 36 respectively, man-hour for manufacturing the heat exchanger 12 can further be reduced.

The second structure 32 having a flat plate shape can be formed easily by cutting out a flat plate, for example. Therefore, it is not necessary to implement a complicated process on the second structure 32, and the fluid-flux portion 35 can be formed by implementing a process mainly on the first structure 31. Consequently, man-hour for manufacturing the heat exchanger 12 can be reduced. The concave portion 37 of the first structure 31 can be formed via a drawing, for example a deep drawing.

The inflow portion 33 and the outflow portion 34 of the first structure 31 can be formed at the same time as the drawing for forming the concave portion 37. By forming the inflow portion 33 and outflow portion 34 together with the concave portion 37, it is possible to eliminate the necessity of an additional work only for forming the inflow portion 33 and the outflow portion 34. With elimination of the additional work, the man-hour and the cost for manufacturing the first structure 31 can be reduced. Thus, the first structure 31 including the concave portion 37, the inflow portion 33, and the outflow portion 34 can also be formed easily with small man-hour.

By forming the second structure 32 in a flat plate shape, the fluid-flux portion 35 can closely contact the portion of the light source unit 11 where the LED chip 17 as the heat source is provided, and thereby the heat exchange can be performed with high efficiency. Accordingly, the heat exchanger 12 and the light source apparatus 10 can be manufactured easily, with an advantage that the heat exchanger 12 can perform the heat exchange with high efficiency. The heat exchange with high efficiency allows increasing the electricity to be fed to the light source apparatus 10, and supplying a brighter light. The light source apparatus 10 is suitable for being used as a light source apparatus of a projector. The light source apparatus 10 is not limited to the configuration of using the LED chip 17, and may be a configuration of using any other solid-state light source, such as a laser diode.

The second structure 32 is not limited to the flat plate shape in whole, as long as at least the portion forming the fluid-flux portion 35 has a flat plate shape. By making at least the portion forming the fluid-flux portion 35 a flat plate shape, the fluid-flux portion 35 can closely contact the heat source, and allow an efficient heat exchange.

Figure 7:
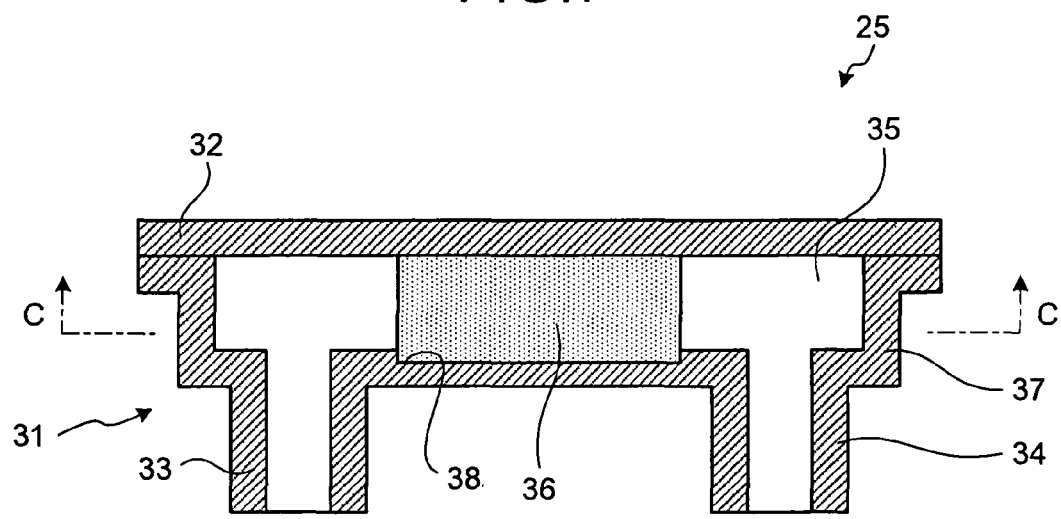
FIG. 7 is a cross sectional view of a configuration of a heat exchanger according to a modification of the first embodiment.

FIG. 7 is a cross sectional view of a configuration of a heat exchanger 25 according to a modification of the first embodiment. The heat exchanger 25 according to this modification includes a notch portion 38 formed in the first structure 31. The depth of the concave portion 37 of the first structure 31 is formed to be less than the height of the corrugated plate 36. The notch portion 38 is formed by notching a portion of the first structure 31 with which the corrugated plate 36 has contact. The notch portion 38 is formed so that the corrugated plate 36 on the side of the first structure 31 can fit therein. The corrugated plate 36 is disposed in a state of fitting in the notch portion 38. The notch portion 38 shown in FIG. 7 allows positioning of the corrugated plate 36 in the flow direction of the refrigerant in the fluid-flux portion 35.

Figure 8:
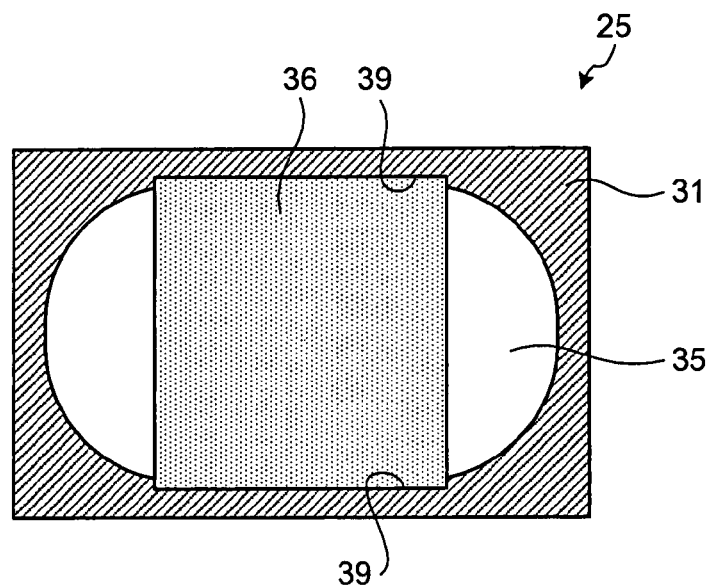
FIG. 8 is a cross sectional view of the configuration shown in FIG. 7 along the line C-C.

FIG. 8 is a cross sectional view of the configuration shown in FIG. 7 along the line C-C. The fluid-flux portion 35 is formed so that the width in a direction orthogonal to the flow direction of the refrigerant in the fluid-flux portion 35 is smaller than the width of the corrugated plate 36. Not only in the cross section shown in FIG. 7 but also in the cross section shown in FIG. 8, a notch portion 39 is formed so that the part of the first structure 31 which contacts the corrugated plate 36 is notched. The notch portion 39 shown in FIG. 8 allows positioning of the corrugated plate 36 in the direction orthogonal to the flow direction of the refrigerant in the fluid-flux portion 35.

By forming the fluid-flux portion 35 in a state that the corrugated plate 36 fits in the notch portions 38 and 39, it becomes possible to accurately position the corrugated plate 36. The fitting of the corrugated plate 36 into the notch portion 38 and 39 allows fixing the corrugated plate 36 at a position corresponding to the heat source in the fluid-flux portion 35, without locking the corrugated plate 36 to the second structure 32. The notch portions 38 and 39 can be formed at the same time as the forming of the first structure 31 via the drawing and the like. Thus, the heat exchanger 25 in which the corrugated plate 36 is positioned at a right place can be manufactured easily. The notch portions 38 and 39 are not limited to the shown shape and position, as long as a part of the corrugated plate 36 can fit therein.

Figure 9:
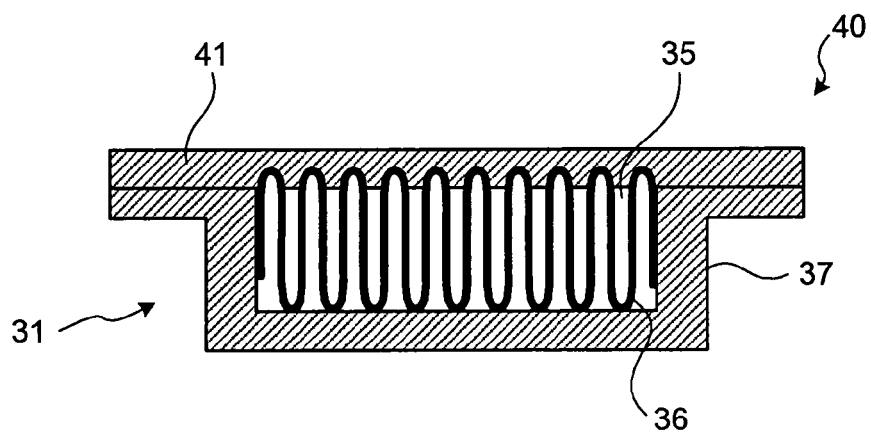
FIG. 9 is a cross sectional view of a configuration of a heat exchanger according to a second embodiment of the invention.
Figure 10:
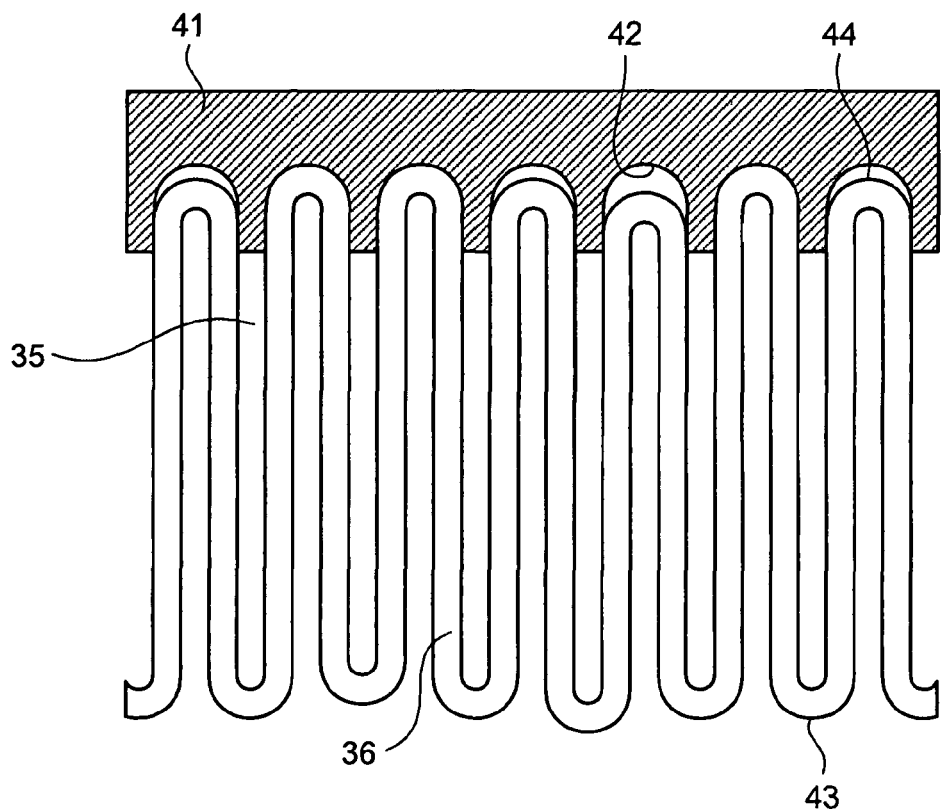
FIG. 10 illustrates a contact portion between the corrugated plate and a second structure.

FIG. 9 is a cross sectional view of a configuration of a heat exchanger 40 according to a second embodiment of the invention. FIG. 10 illustrates a contact portion between the corrugated plate 36 and a second structure 41 of the heat exchanger 40. The heat exchanger 40 can be applied to the light source apparatus 10 according to the first embodiment. The heat exchanger 40 according to the second embodiment includes the second structure 41 provided with a plurality of grooves 42. The same components as the first embodiment are provided with the same numerals, and the explanation thereof is omitted here. The groove 42 is formed on a surface of the second structure 41 on the side of the corrugated plate 36. The surface of the second structure 41 on the side of the light source unit 11 is formed to be substantially flat. By forming the surface on the light source unit 11 side to be substantially flat, a portion provided with the LED chip 17 serving as the heat source of the light source unit 11 can closely contact the fluid-flux portion 35, and thereby the heat exchange can be performed with high efficiency.

The corrugated plate 36 has a first fold 43 formed on the first structure 31 side, and a second fold 44 formed on the second structure 41 side. The corrugated plate 36 forms a fine channel whose width is substantially the same as the thickness of the plate member forming the corrugated plate 36. The groove 42 is provided at the same pitch as the second fold 44 so that the groove 42 substantially corresponds to the second fold 44 of the corrugated plate 36 on the side of the second structure 41.

When the corrugated plate 36 is formed via the press work and the like by using the gear roll, there is a possibility of having fluctuation in the height between the first fold 43 and the second fold 44 as shown in FIG. 10. However, the groove 42 provided to the second structure 41 enables the corrugated plate 36 on the second structure 41 side to contact the second structure 41 directly, even with the fluctuation in the height of the second fold 44.

Figure 11:
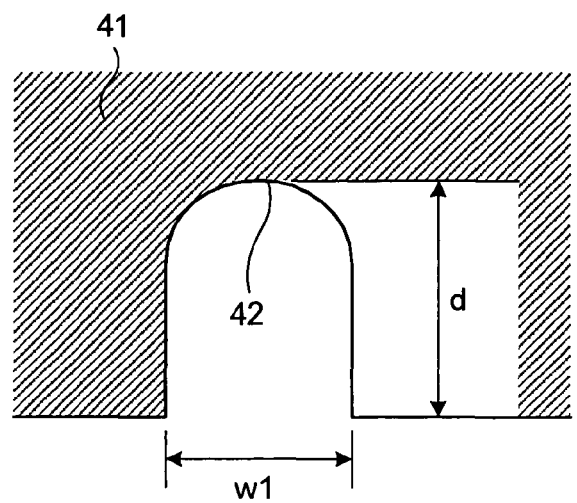
FIG. 11 illustrates a shape of a groove.
Figure 12:
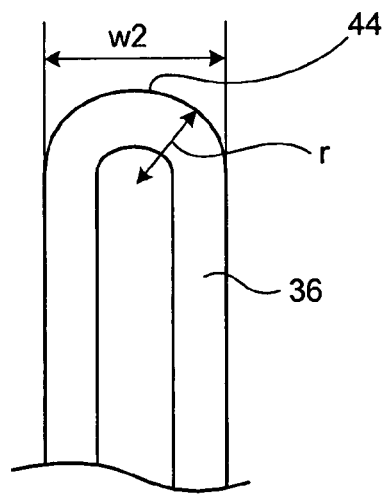
FIG. 12 illustrates a shape of the corrugated plate on the second structure side.

FIG. 11 illustrates a shape of the groove 42. FIG. 12 illustrates a shape of the corrugated plate 36 on the second structure 41 side. The groove 42 is formed so that the corrugated plate 36 on the second structure 41 side can fit therein via an interference fit. The groove 42 is formed to have a width w1 which is smaller than an outside diameter w2 of the second fold 44. With such a configuration, the corrugated plate 36 can fit in the groove 42 via the interference fit. The fitting of the corrugated plate 36 into the groove 42 via the interference fit allows a direct and secure contact of the corrugated plate 36 to the second structure 41, and further allows a secure fixation of the corrugated plate 36 in the fluid-flux portion 35.

The heat exchanger 40 transmits the heat from the heat source efficiently to the corrugated plate 36 by the direct and secure contact of the corrugated plate 36 to the second structure 41 on the heat source side of the fluid-flux portion 35, and thereby the heat exchange can be performed with high efficiency. Since the corrugated plate 36 can fit in the groove 42 and the corrugated plate 36 can be fixed in the fluid-flux portion 35, a compression force by the first structure 31 and the second structure 41 is not necessary, and thereby preventing a deformation of the corrugated plate 36. Furthermore, it is also possible to eliminate an additional work for arranging the second fold 44 in line to have the same height, and a process for jointing the second structure 41 and the corrugated plate 36. Thus, the invention is advantageous in that the heat exchanger, which can perform the heat exchange with high efficiency, can be manufactured easily.

A length d in the depth direction of the groove 42 is more than a bending radius r of an outer circumference of the second fold 44 and shorter than the double of the bending radius r, r being equal to w2/2. By setting d>r, the corrugated plate 36 on the second structure 41 side can securely and directly contact the wall of the groove 42 even with the fluctuation in the height of the second fold 44. Accordingly, the contact area between the corrugated plate 36 and the wall of the groove 42 can be secured sufficiently, and the heat from the heat source can be transmitted to the corrugated plate 36 efficiently.

The corrugated plate 36 except for the portion fitting in the groove 42 forms the fine channel. By setting d<2×r, it becomes possible to secure sufficient contact area between the refrigerant and the channel wall.

The above setting also allows securing the thickness of the second structure 41, and thereby it is possible to secure the strength of the second structure 41 as well as to reduce the degradation of the heat-transmission efficiency in the second structure 41. In this manner, by limiting the depth of the groove 42, it is possible to perform the heat exchange with higher efficiency, secure the strength of the second structure 41, and also reduce the labor required for the process of the groove 42.

The inventors have performed an experiment in which an experimental heat source having heat quantity of 40 watts is cooled by using the heat exchanger of the same configuration according to the invention. For the refrigerant, the amount of 3 ml/sec. of water is used. The difference in temperature between the water in the inflow portion of the heat exchanger and the bottom surface of the experimental heat source is checked for a first case: no groove 42 is provided, a second case: a groove 42 having the same depth as the bending radius r is provided, and a third case: a groove 42 having double depth of the bending radius r is provided. The result is 11.9° C., 9.1° C., and 6.8° C., respectively. Smaller gap in temperature between the water of the inflow portion side and the bottom surface of the heat source indicates that the heat exchanger has higher cooling efficiency. Therefore, the heat exchanger exhibits higher cooling efficiency in the third case, compared to the first case and the second case.

The second structure 41 can be formed by implementing the groove 42 on the flat plate. Therefore, the second structure 41 does not need any complicated process other than the forming of the groove 42, and the fluid-flux portion 35 can be formed by implementing a process mainly on the first structure 31. Consequently, man-hour for manufacturing the heat exchanger 40 can be reduced in the second embodiment, too.

Figure 13:
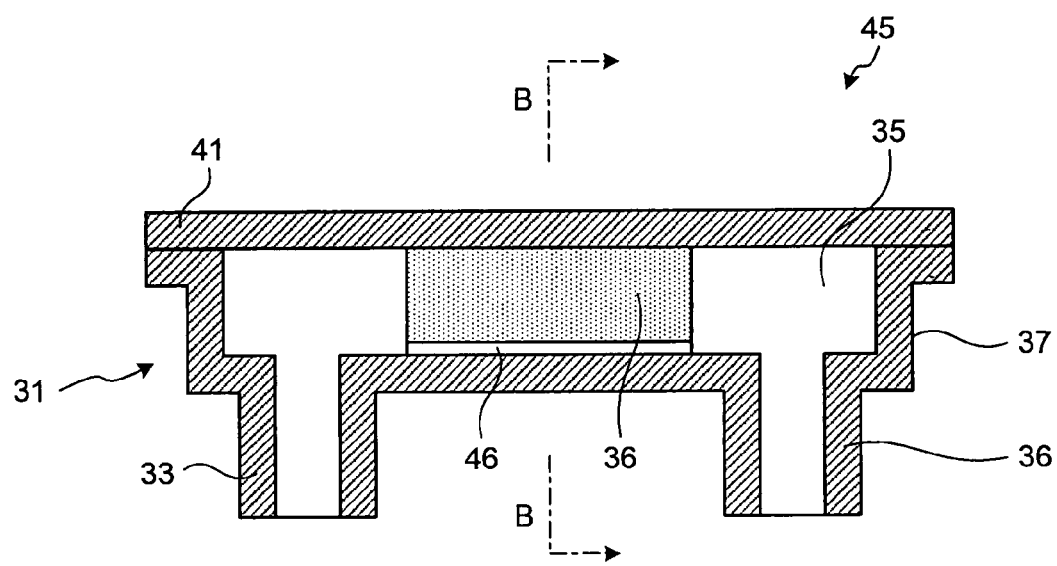
FIG. 13 is a cross sectional view of a configuration of a heat exchanger according to a modification of the second embodiment.

FIG. 13 is a cross sectional view of a configuration of a heat exchanger 45 according to a modification of the second embodiment. The heat exchanger 45 according to this modification includes a filling member. A porous metal member 46 is the filling member provided between the first structure 31 and the corrugated plate 36. The porous metal member 46 is a porous member having a lot of holes. The porous metal member 46 is made of copper material, for example similarly to the first structure 31 and the second structure 41.

Figure 14:
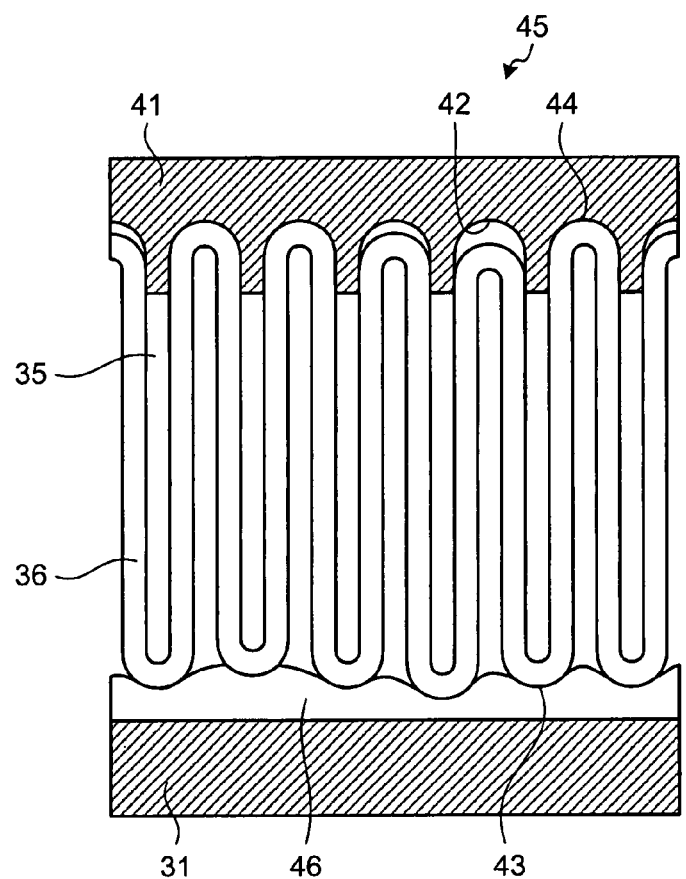
FIG. 14 is an enlarged cross sectional view of the configuration shown in FIG. 13 along the line B-B.

FIG. 14 is an enlarged cross sectional view of the configuration shown in FIG. 13 along the line B-B. When the first structure 31 and the second structure 41 are jointed in a state that the porous metal member 46 is sandwiched between the first structure 31 and the corrugated plate 36, the corrugated plate 36 on the first structure 31 side is pressed to the porous metal member 46. The porous metal member 46 deforms accordingly while the corrugated plate 36 is pressed thereto.

The porous metal member 46 is flexibly deformable in accordance with the shape of the corrugated plate 36 on the first structure 31 side. Therefore, the porous metal member 46 can be filled in the clearance between the first structure 31 and the first fold 43 even with the fluctuation in the height of the first fold 43. By filling the porous metal member 46 in the clearance between the first structure 31 and the first fold 43, it is possible to prevent the leakage of the refrigerant into the clearance between the first structure 31 and the first fold 43, and to increase the amount of the refrigerant passing through the fine channel. The increase in the amount of the refrigerant passing through the fine channel allows the heat exchange with still higher efficiency.

The porous metal member 46 pushes back the corrugated plate 36 to the second structure 41 side due to a restoring force against the pressing of the corrugated plate 36. By using the porous metal member 46, it becomes possible to make the corrugated plate 36 securely and directly contact the second structure 41, and to transmit the heat from the heat source to the corrugated plate 36 efficiently. The heat exchanger 45 is not limited to the configuration that all of the first structure 31, the second structure 41, and the porous metal member 46 are made of copper material. For example, the corrosion potential may be provided so that at least one of the first structure 31 and the second structure 41 corrodes preferentially to the porous metal member 46. Thus, the leakage of the refrigerant into the clearance between the first structure 31 and the first fold 43 can be prevented over a long period of time, and the heat exchange with high efficiency can be performed continuously.

The filing member may be any member other than the porous metal member 46, as long as the member can fill the clearance between the first structure 31 and the first fold 43, and is an insoluble material to the refrigerant. Any porous member other than the porous metal member 46, for example, a spongy member, a fiber, and an elastic member such as a rubber can be used as the filling member. The filling member is not limited to the member which prevents the leakage of the refrigerant into the clearance between the first structure 31 and the first fold 43 thoroughly, as long as the member can at least reduce the amount of the refrigerant leaking into the clearance therebetween. As long as the amount of the fluid leaking to the clearance between the first structure 31 and the first fold 43 can be reduced, the amount of the fluid passing through the fine channel can increase.

Figure 15:
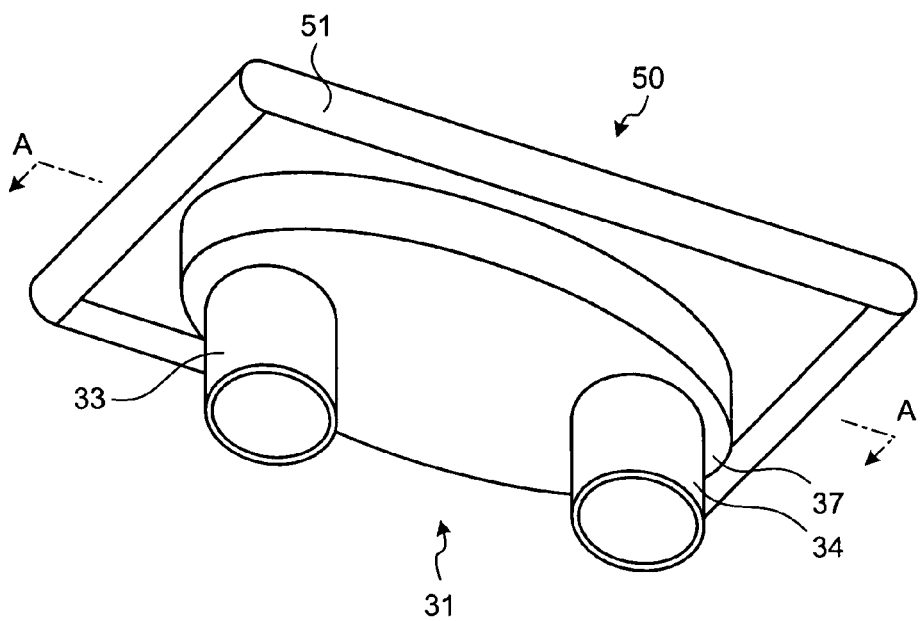
FIG. 15 is a perspective view of a configuration of a heat exchanger according to a third embodiment of the invention.

FIG. 15 is a perspective view of a configuration of a heat exchanger 50 according to a third embodiment of the invention. The heat exchanger 50 can be applied to the light source apparatus 10 according to the first embodiment. The heat exchanger 50 according to this embodiment includes a caulking portion 51. The same components as the first embodiment are provided with the same numerals, and the explanation thereof is omitted here. The caulking portion 51 is provided in the periphery of the fluid-flux portion not shown.

Figure 16:
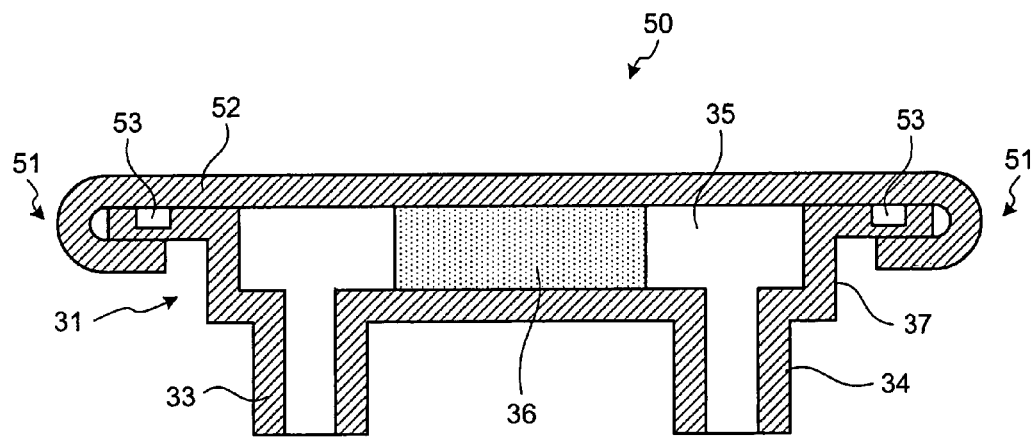
FIG. 16 is a cross sectional view of the configuration shown in FIG. 15 along the line A-A.

FIG. 16 is a cross sectional view of the configuration shown in FIG. 15 along the line A-A. A second structure 52 forming the fluid-flux portion 35, except for the periphery where the caulking portion 51 is formed, has a flat plate shape. The fluid-flux portion 35 is formed by jointing the flat plate portion of the second structure 52 and the concave portion 37 of the first structure 31 together. A joint portion of the second structure 52 with the first structure 31 is deformed to pinch the periphery of the first structure 31. The caulking portion 51 is formed by clinching the first structure 31 with the second structure 52. The caulking portion 51 serves to joint the first structure 31 and the second structure 52 by clinching.

A packing 53 is provided at a joint position of the first structure 31 with the second structure 52. The packing 53 is a sealing member which seals the first structure 31 and the second structure 52 at the caulking portion 51. The packing 53 is provided in the circumference of the fluid-flux portion 35 in the same manner as the caulking portion 51. The heat exchanger 50 provided with the packing 53 can prevent the leakage of the refrigerant from the joint of the first structure 31 and the second structure 52 constituting the fluid-flux portion 35. The sealing member is not limited to the packing 53 as long as it can seal the first structure 31 and the second structure 52 at the caulking portion 51. For example, a sealant capable of preventing the leakage of the refrigerant may be employed as the sealing member.

The caulking portion 51 can be formed via the plastic deformation of the second structure 52 so as to clinch the periphery of the first structure 31. Since the first structure 31 and the second structure 52 are jointed via the plastic deformation at the caulking portion 51, the entirety of the fluid-flux portion 35 can be formed only by a process for implementing the plastic deformation on the member. Since the process such as brazing is not required in the forming of the fluid-flux portion 35, it becomes possible to reduce the manufacturing cost for the heat exchanger 50 and to manufacture the heat exchanger 50 in an easy way. Thus, the present invention is advantageous in that the manufacturing cost for the heat exchanger 50 can be reduced and the heat exchanger 50 can be manufactured in an easy way.

Figure 17:
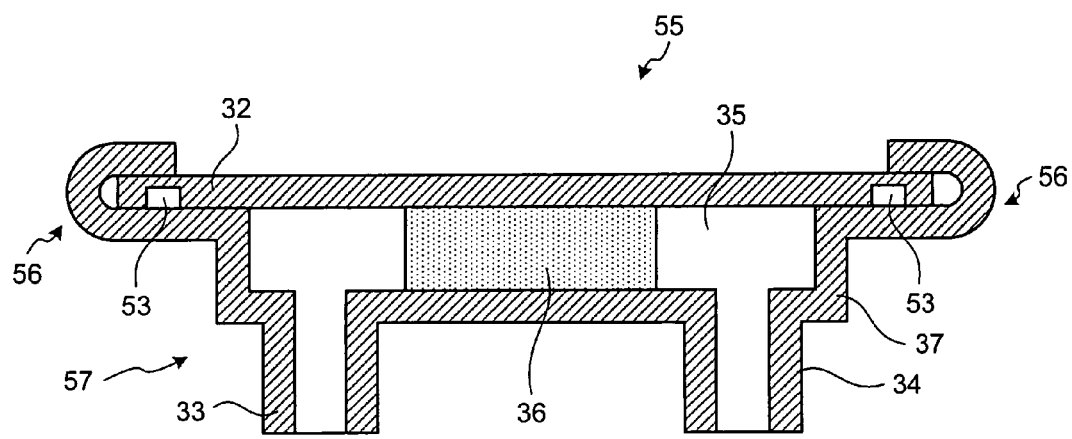
FIG. 17 is a cross sectional view of a configuration of a heat exchanger according to a first modification of the third embodiment.

FIG. 17 is a cross sectional view of a configuration of a heat exchanger 55 according to a first modification of the third embodiment. In the heat exchanger 55 according to this modification, a joint portion of a first structure 57 with the second structure 32 is deformed so as to clinch the periphery of the second structure 32. A caulking portion 56 is formed by clinching the second structure 32 with the first structure 57. The packing 53 is provided at a joint position of the second structure 32 with the first structure 57. The caulking portion 56 can be formed via the plastic deformation of the first structure 57 so as to clinch the periphery of the second structure 32.

As explained with reference to FIGS. 16 and 17, the caulking portion can be formed via the plastic deformation on at least one of the first structure and the second structure. Therefore, the first structure and the second structure can be jointed without an increase in the number of parts. The packing 53 may be provided to any one of the first structure and the second structure, and may be provided separately between the first structure and the second structure similarly to a modification to be described later.

Figure 18:
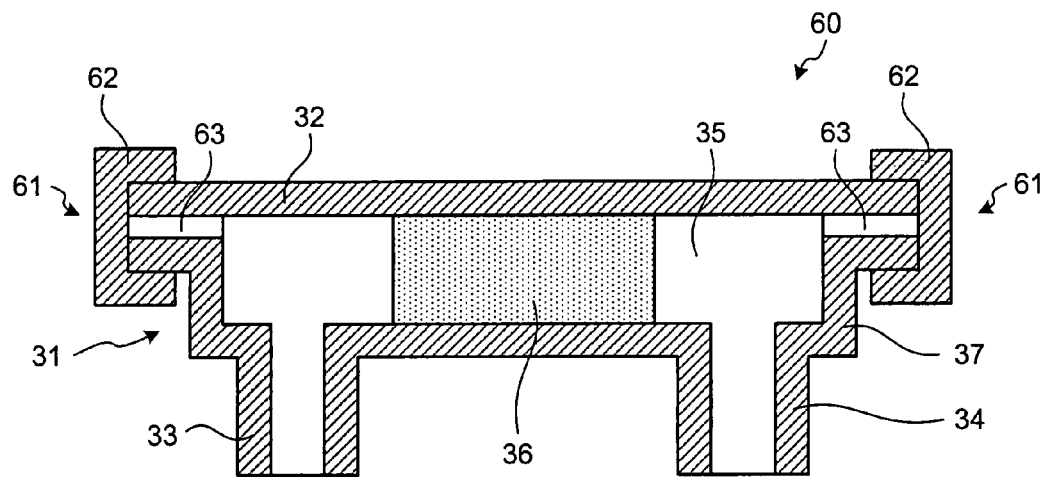
FIG. 18 is a cross sectional view of a configuration of a heat exchanger according to a second modification of the third embodiment.

FIG. 18 is a cross sectional view of a configuration of a heat exchanger 60 according to a second modification of the third embodiment. The heat exchanger 60 according to this modification includes a caulking portion 61 provided with a pinching member 62. The pinching member 62 is provided to the periphery of the first structure 31 and the second structure 32. The pinching member 62 pinches the first structure 31, a packing 63, and the second structure 32. The pinching member 62 can be provided in the circumference of the fluid-flux portion 35 in the same way as the caulking portion 61.

When the caulking portion 61 is formed by using the pinching member 62, it is not necessary to deform the first structure 31 and the second structure 32 at the caulking portion 61. Since no deformation of the first structure 31 and the second structure 32 at the caulking portion 61 is necessary, it is possible to form the fluid-flux portion 35 in an easy way. The packing 63 may not be provided separately between the first structure 31 and the second structure 32, and may be provided to any one of the first structure 31 and the second structure 32.

Figure 19:
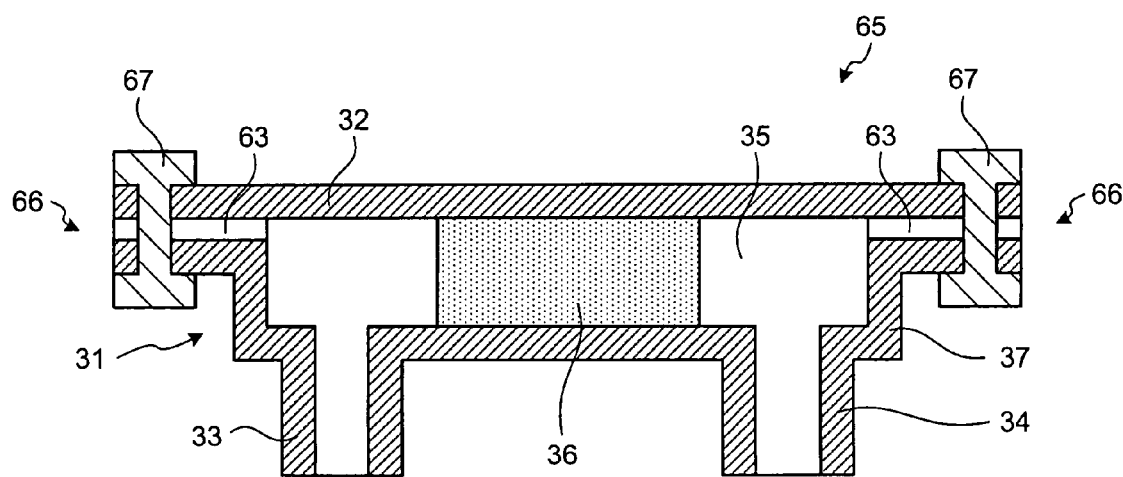
FIG. 19 is a cross sectional view of a configuration of a heat exchanger according to a third modification of the third embodiment.

FIG. 19 is a cross sectional view of a configuration of a heat exchanger 65 according to a third modification of the third embodiment. The heat exchanger 65 according to this modification includes a pin-caulking portion 66 as a caulking portion provided with a pin 67. The pin 67 is provided so as to penetrate the first structure 31, the packing 63, and the second structure 32 in the periphery of the first structure 31 and the second structure 32. The pin 67 has one end protruding on the first structure 31 side and the other end protruding on the second structure 32 side, both ends being squashed up. With its ends squashed, the pin 67 pinches the first structure 31, the packing 63, and the second structure 32. A plurality of pins 67 can be provided in the circumference of the fluid-flux portion 35.

When the pin-caulking portion 66 is formed by using the pin 67, it is not necessary to deform the first structure 31 and the second structure 32 at the pin-caulking portion 66 similarly to the case of the second modification of the third embodiment. Since no deformation of the first structure 31 and the second structure 32 at the pin-caulking portion 66 is necessary, it is possible to form the fluid-flux portion 35 in an easy way. The packing 63 may not be provided separately between the first structure 31 and the second structure 32, and may be provided to any one of the first structure 31 and the second structure 32. Similarly to the second embodiment, the heat exchangers 50, 55, 60, and 65 may have the configuration that the second structures 32 and 52 are provided with the groove, and the fold of the corrugated plate 36 fits in the groove.

Figure 20:
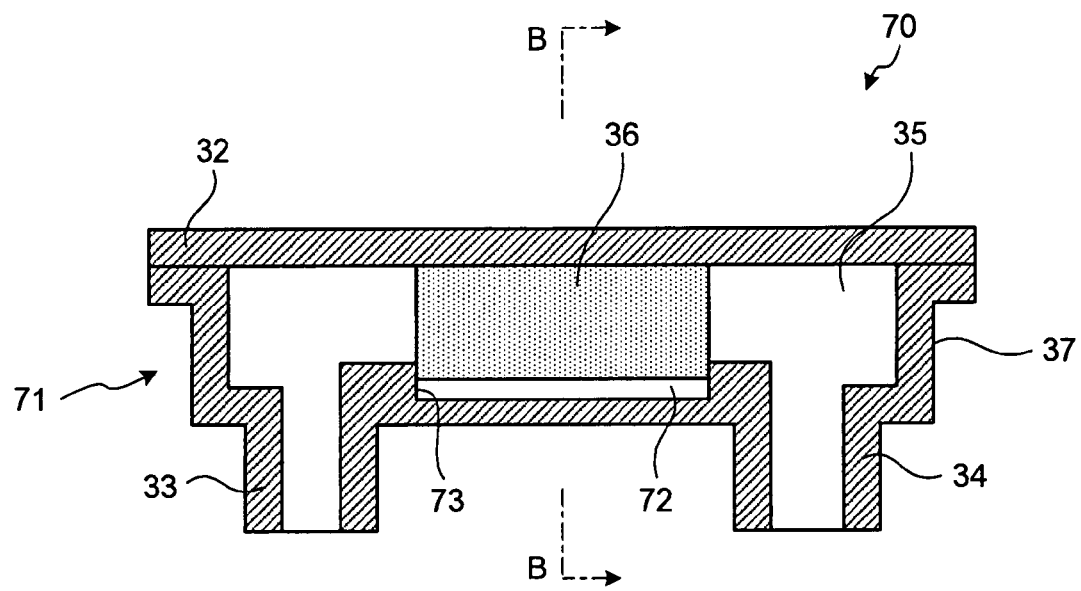
FIG. 20 is a cross sectional view of a configuration of a heat exchanger according to a fourth embodiment of the invention.

FIG. 20 is a cross sectional view of a configuration of a heat exchanger 70 according to a fourth embodiment of the invention. The heat exchanger 70 can be applied to the light source apparatus 10 according to the first embodiment. The heat exchanger 70 according to this embodiment includes a pressing member. The same components as the first embodiment are provided with the same numerals, and the explanation thereof is omitted here.

The depth of the concave portion 37 of a first structure 71 between the inflow portion 33 and the outflow portion 34 is formed to be less than the height of the corrugated plate 36. A notch portion 73 is formed by notching a portion, where the corrugated plate 36 is provided, of the concave portion 37 between the inflow portion 33 and the outflow portion 34. The notch portion 73 is formed so that the corrugated plate 36 on the side of the first structure 71 can fit therein.

A porous metal member 72 is provided between the corrugated plate 36 and the first structure 71. The porous metal member 72 is the pressing member. The notch portion 73 is formed to have the depth larger than the thickness of the porous metal member 72. The porous metal member 72 can be fixed between the corrugated plate 36 and the first structure 71 by making the corrugated plate 36 fit in the notch portion 73. The notch portion 73 also serves to position the corrugated plate 36 similarly to the heat exchanger 25 of FIG. 7. The porous metal member 72 is a porous member having a lot of holes. The porous metal member 72 is made of copper material, for example similarly to the first structure 71 and the second structure 32.

Figure 21:
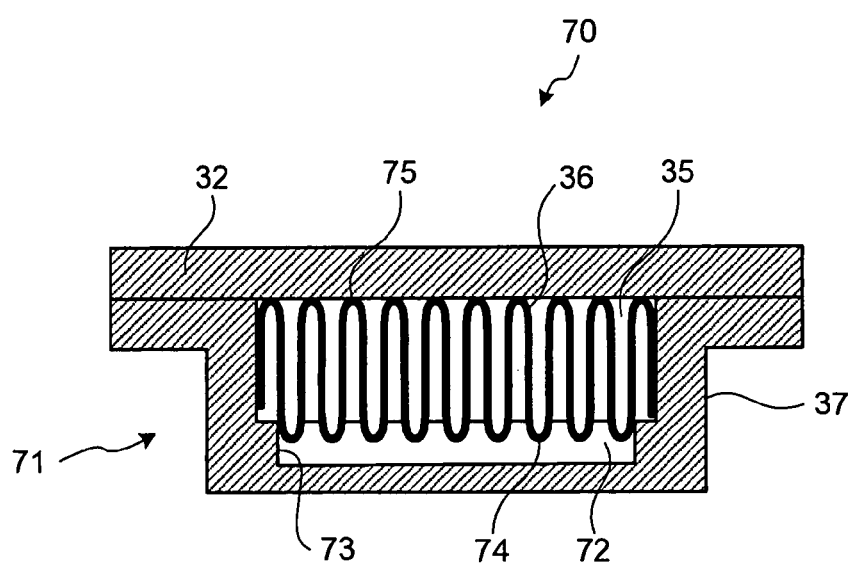
FIG. 21 is a cross sectional view of the configuration shown in FIG. 20 along the line B-B.

FIG. 21 is a cross sectional view of the configuration shown in FIG. 20 along the line B-B. The porous metal member 72 is provided between the first structure 71 and a first fold 74 of the corrugated plate 36 on the first structure 71 side. The notch portion 73 of the first structure 71 is formed so that the distance between the porous metal member 72 and the second structure 32 is shorter than the length between the first fold 74 of the corrugated plate 36 and a second fold 75 on the second structure 32 side of the corrugated plate 36.

When the first structure 71 and the second structure 32 are jointed in a state that the corrugated plate 36 is disposed in the concave portion 37 of the first structure 71, the porous metal member 72 deforms accordingly while the corrugated plate 36 is pressed to the porous metal member 72. The porous metal member 72 pushes back the corrugated plate 36 to the second structure 32 side due to a restoring force against the pressing of the corrugated plate 36. Thus, the porous metal member 72 makes the second fold 75 of the corrugated plate 36 press against the second structure 32.

Figure 22:
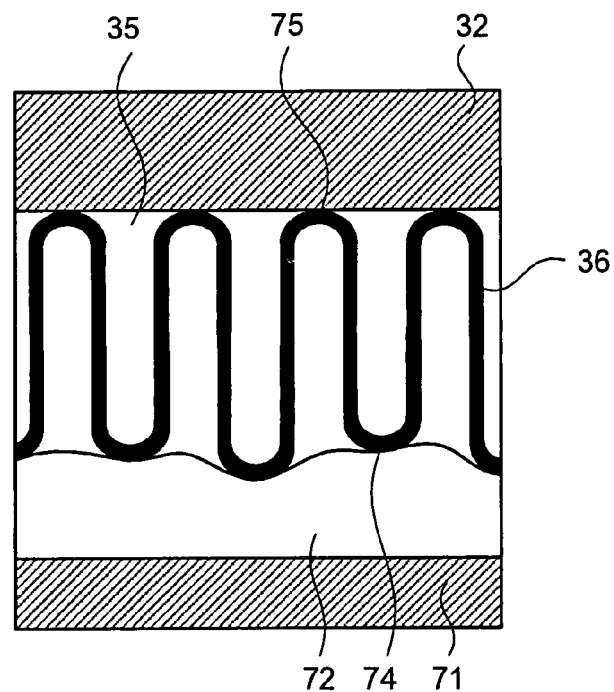
FIG. 22 illustrates a contact portion and the like between a porous metal member and a first fold.

FIG. 22 illustrates a contact portion between the porous metal member 72 and the first fold 74, and a contact portion between the second structure 32 and the second fold 75. If a clearance arises between the second fold 75 and the second structure 32 when the first structure 71 and the second structure 32 are jointed, the heat cannot be transmitted from the second structure 32 to the corrugated plate 36, which leads to a difficulty in an efficient heat exchange. Besides, if the second fold 75 is squashed up by the second structure 32 when the first structure 71 and the second structure 32 are jointed, the fine channel in the fluid-flux portion 35 is deformed, and thereby the flow of the refrigerant becomes uneven, which leads to the difficulty in an efficient heat exchange.

When the corrugated plate 36 is formed via the press work and the like using the gear roll, there is a possibility of having fluctuation in the length between the first fold 74 and the second fold 75. The porous metal member 72 is flexibly deformable in accordance with the shape of the first fold 74 of the corrugated plate 36. Such flexible deformation of the porous metal member 72 enables the second fold 75 to securely and directly contact the second structure 32 of flat shape.

The heat exchanger 70 can transmit the heat from the heat source efficiently to the corrugated plate 36 by making the corrugated plate 36 securely and directly contact the second structure 32. The heat exchanger 70 can perform the heat exchange with high efficiency by transmitting the heat from the heat source to the corrugated plate 36 efficiently. By employing the porous metal member 72, the corrugated plate 36 can securely and directly contact the second structure 32 without an additional process for arranging the second fold 75 in line to have the same height, and a fixation of the corrugated plate 36 to the second structure 32. Accordingly, the heat exchanger 70 can be manufactured with small man-hour.

Figure 23:
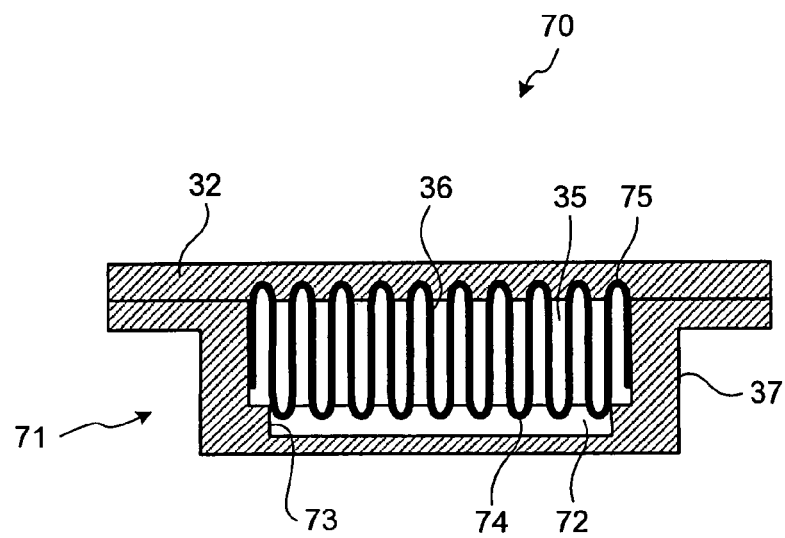
FIG. 23 illustrates a configuration where a second fold fits in a groove.
Figure 24:
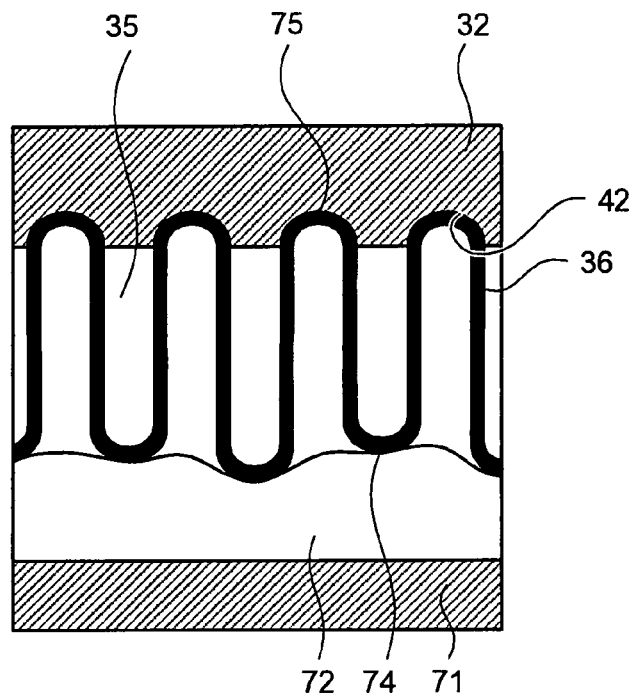
FIG. 24 illustrates the configuration where a second fold fits in a groove.

The heat exchanger 70 is not limited to the configuration that all of the first structure 71, the second structure 32, and the porous metal member 72 are made of copper material. For example, the corrosion potential may be provided so that at least one of the first structure 71 and the second structure 32 corrodes preferentially to the porous metal member 72. Thus, the corrugated plate 36 can be in direct contact with the second structure 32 over a long period of time, and the heat exchange with high efficiency can be performed continuously. The pressing member may be any member other than the porous metal member 72, as long as the member can press the second fold 75 to the second structure 32, and is an insoluble material to the refrigerant. Any porous member other than the porous metal member 72, and an elastic member such as a rubber can be used as the pressing member, for example. The heat exchanger 70 according to the fourth embodiment may be provided with the groove on the second structure 32 similarly to the second embodiment. As shown in FIGS. 23 and 24, the heat exchanger 70 can have the configuration that the second fold 75 fits in the groove 42 of the second structure 32.

Figure 25:
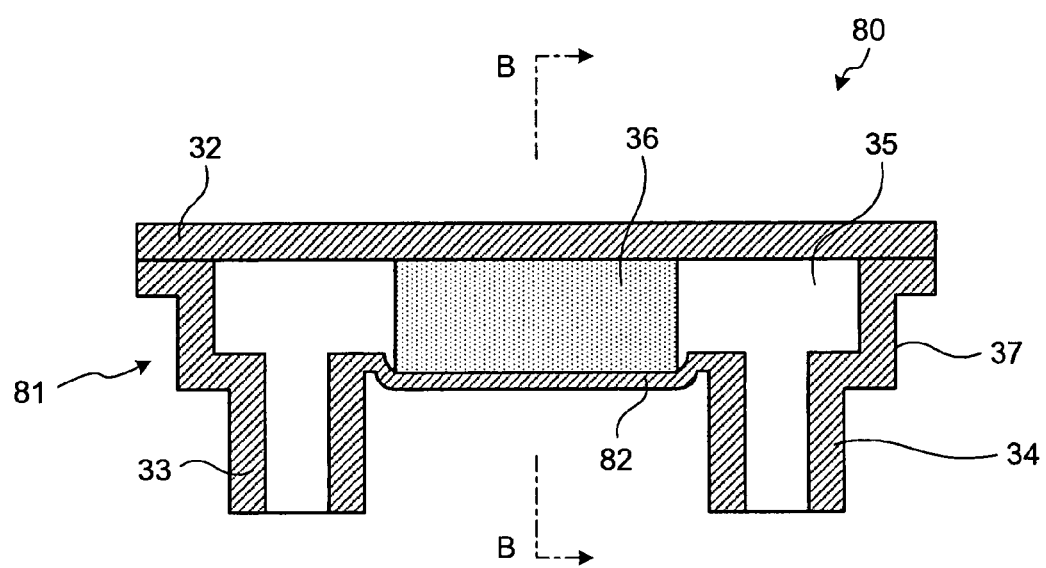
FIG. 25 is a cross sectional view of a configuration of a heat exchanger according to a fifth embodiment of the invention.
Figure 26:
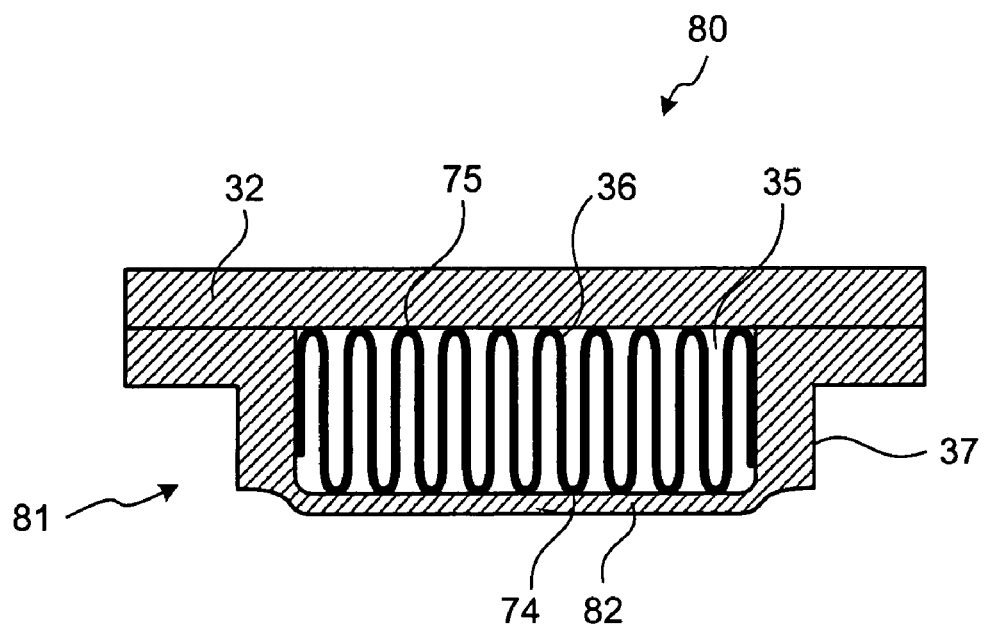
FIG. 26 is a cross sectional view of the configuration shown in FIG. 25 along the line B-B.

FIG. 25 is a cross sectional view of a configuration of a heat exchanger 80 according to a fifth embodiment of the invention. FIG. 26 is a cross sectional view of the configuration shown in FIG. 25 along the line B-B. The heat exchanger 80 can be applied to the light source apparatus 10 according to the first embodiment. The heat exchanger 80 includes a press-deformation portion 82 provided to a first structure 81. The same components as the first embodiment are provided with the same numerals, and the explanation thereof is omitted here. The press-deformation portion 82 is provided to a portion between the inflow portion 33 and the outflow portion 34 in the first structure 81, i.e., the portion corresponding to the corrugated plate 36 in the first structure 81 and the vicinity thereof.

Figure 27:
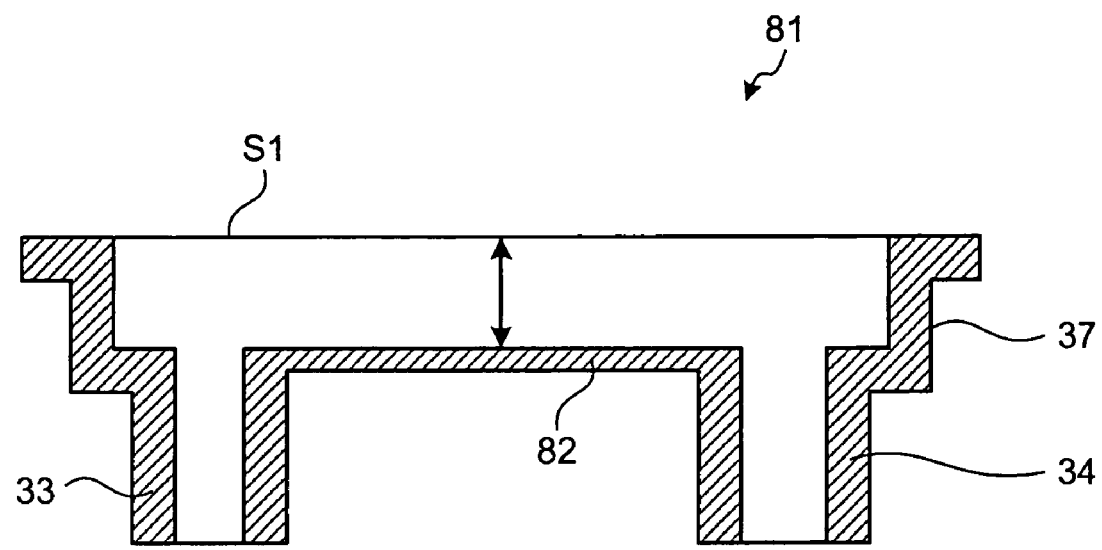
FIG. 27 illustrates a state of a first structure before the corrugated plate is pressed to the first structure.

FIG. 27 illustrates a state of the first structure 81 before the corrugated plate 36 is pressed to the first structure 81. The portion corresponding to the corrugated plate 36 in the first structure 81, i.e., the press-deformation portion 82 before being deformed has a flat plate shape. The press-deformation portion 82 before being deformed can be obtained by forming the portion between the inflow portion 33 and the outflow portion 34 thinly enough to be deformable. The first structure 81 is formed preliminarily so that the distance between a surface S1 of the first structure 81 to be in contact with the second structure 32 and the portion corresponding to the corrugated plate 36 is smaller than the length between the first fold 74 and the second fold 75 of the corrugated plate 36, the distance being shown with two-headed arrow in FIG. 27.

When the first structure 81 and the second structure 32 are jointed in a state where the corrugated plate 36 is disposed in the concave portion 37 of the first structure 81, the press-deformation portion 82 deforms accordingly while the corrugated plate 36 is pressed thereto, as shown in FIG. 25. The press-deformation portion 82 is formed by deforming the portion corresponding to the corrugated plate 36 in the first structure 81 and the vicinity thereof according to the pressing of the corrugated plate 36. The press-deformation portion 82 pushes back the corrugated plate 36 to the second structure 32 side due to the restoring force against the pressing of the corrugated plate 36. Thus, the press-deformation portion 82 makes the second fold 75 of the corrugated plate 36 on the second structure 32 side press against the second structure 32. In this way, it becomes possible to make the second fold 75 securely and directly contact the second structure 32 of flat plate shape. Since the corrugated plate 36 having the corrugation can surely have sufficient rigidity against the deformation of the press-deformation portion 82, the press-deformation portion 82 can be formed without squashing the second fold 75.

The heat exchanger 80 can transmit the heat from the heat source efficiently to the corrugated plate 36 by the direct and secure contact of the corrugated plate 36 to the second structure 32. With such an efficient transmission of the heat from the heat source to the corrugated plate 36, the heat exchanger 80 can perform the heat exchange with high efficiency. The press-deformation portion 82 can be formed easily at the same time as the joint of the first structure 81 and the second structure 32. Furthermore, the corrugated plate 36 can securely and directly contact the second structure 32 without an additional work for arranging the second fold 75 in line to have the same height, and a fixation process of the corrugated plate 36 to the second structure 32. Accordingly, the heat exchanger 80 can be manufactured with small man-hour.

Figure 28:
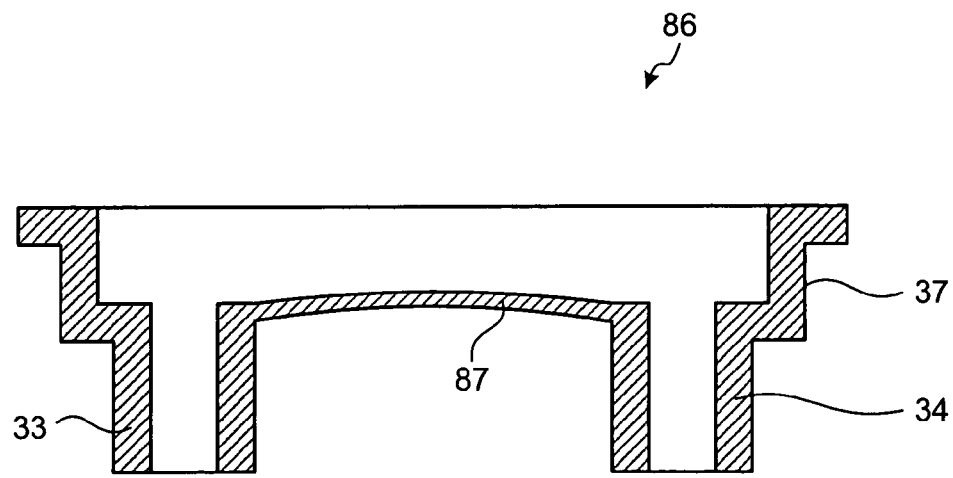
FIG. 28 is a cross sectional view of a configuration of a first structure according to a first modification of the fifth embodiment.

FIG. 28 is a cross sectional view of a configuration of a first structure 86 according to a first modification of the fifth embodiment. The first structure 86 according to this modification can be applied to the heat exchanger 80. The first structure 86 according to this modification includes a press-deformation portion 87 which is formed by deforming from a state where the center portion corresponding to the corrugated plate 36 in the first structure 86 is formed to have convex shape toward the corrugated plate 36 side. The portion corresponding to the corrugated plate 36 in the first structure 86, i.e., the press-deformation portion 87 before being deformed has a curved surface shape whose center is convex.

Figure 29:
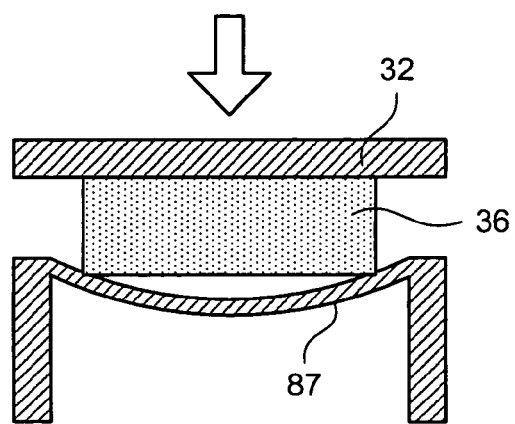
FIG. 29 illustrates a case where a corrugated plate is pressed to a press-deformation portion of a flat plate shape.

For example, when the corrugated plate 36 is pressed to the press-deformation portion 87 having a flat plate shape which is substantially parallel to the second structure 32, there is a possibility that only an outer edge portion of the corrugated plate 36 is pressed to the press-deformation portion 87, as shown in FIG. 29. When only the outer edge portion of the corrugated plate 36 is pressed strongly to the press-deformation portion 87, it is difficult to make the corrugated plate 36, especially the center thereof, directly contact the second structure 32. If the corrugated plate 36 cannot directly and evenly contact the second structure 32, it becomes difficult to transmit the heat from the heat source efficiently to the corrugated plate 36. Moreover, if the additional work for making the corrugated plate 36 entirely contact the second structure 32 is necessary, the man-hour for manufacturing the heat exchanger increases.

By making the center portion corresponding to the corrugated plate 36 in the first structure 86 is formed to be convex toward the corrugated plate 36 side, the first fold 74 of the corrugated plate 36 can surely be pressed to the press-deformation portion 87. By making the first fold 74 of the corrugated plate 36 surely press against the press-deformation portion 87, the second fold 75 of the corrugated plate 36 can be pressed to the second structure 32. Accordingly, the heat exchange with still higher efficiency can be performed.

Figure 30:
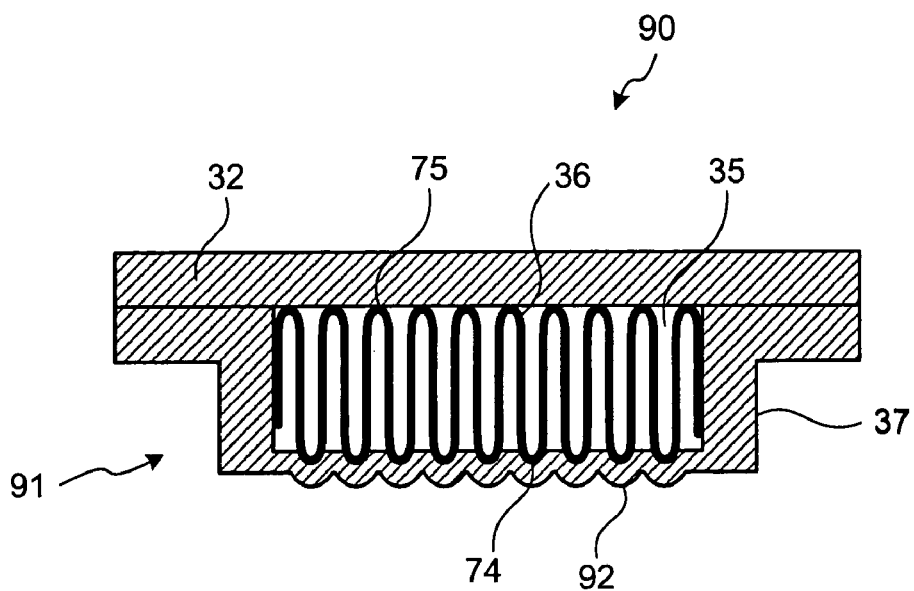
FIG. 30 is a cross sectional view of a configuration of a heat exchanger according to a second modification of the fifth embodiment.
Figure 31:
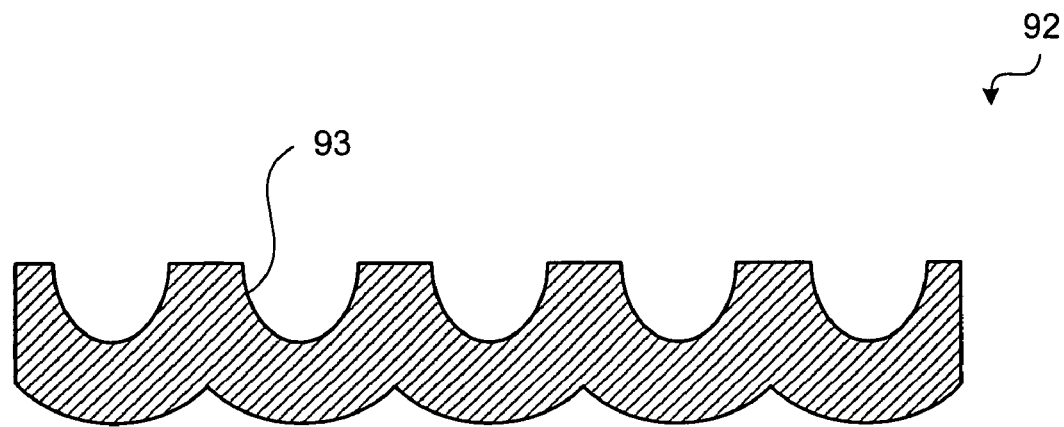
FIG. 31 illustrates a groove provided to the press-deformation portion.

FIG. 30 is a cross sectional view of a configuration of a heat exchanger 90 according to a second modification of the fifth embodiment. The heat exchanger 90 according to this modification includes a press-deformation portion 92 provided with a groove. As shown in FIG. 31, the press-deformation portion 92 has a plurality of grooves 93. The groove 93 is provided so as to correspond to the first fold 74 of the corrugated plate 36 on a first structure 91 side.

Figure 32:
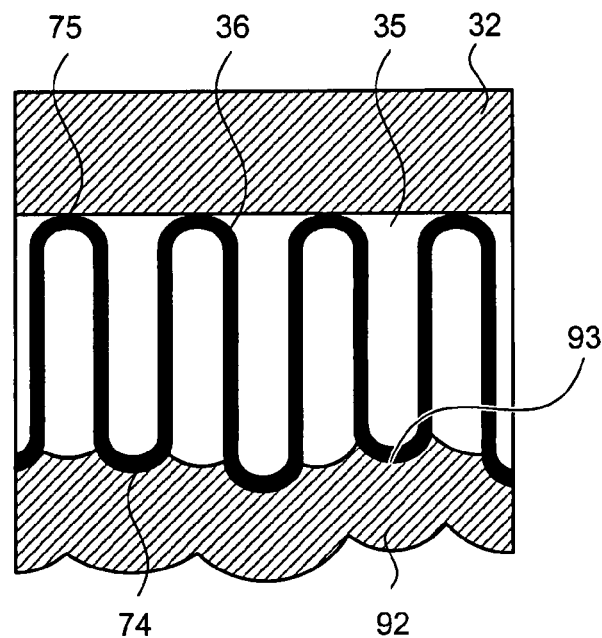
FIG. 32 illustrates a contact portion and the like between the press-deformation portion and the first fold.

FIG. 32 illustrates a contact portion between the press-deformation portion 92 and the first fold 74, and a contact portion between the second structure 32 and the second fold 75. If a clearance arises between the second fold 75 and the second structure 32 when the first structure 91 and the second structure 32 are jointed, the heat cannot be transmitted from the second structure 32 to the corrugated plate 36, which leads to a difficulty in an efficient heat exchange. Besides, if the second fold 75 is squashed up by the second structure 32 when the first structure 91 and the second structure 32 are jointed, the fine channel in the fluid-flux portion 35 is deformed, and thereby the flow of the refrigerant becomes uneven, which leads to the difficulty in an efficient heat exchange. When the corrugated plate 36 is formed via the press work and the like by using the gear roll, there is a possibility of having fluctuation in the height between the first fold 74 and the second fold 75. However, the press-deformation portion 92 provided with the groove 93 can surely push back the first fold 74 to the second structure 32 side.

Figure 33:
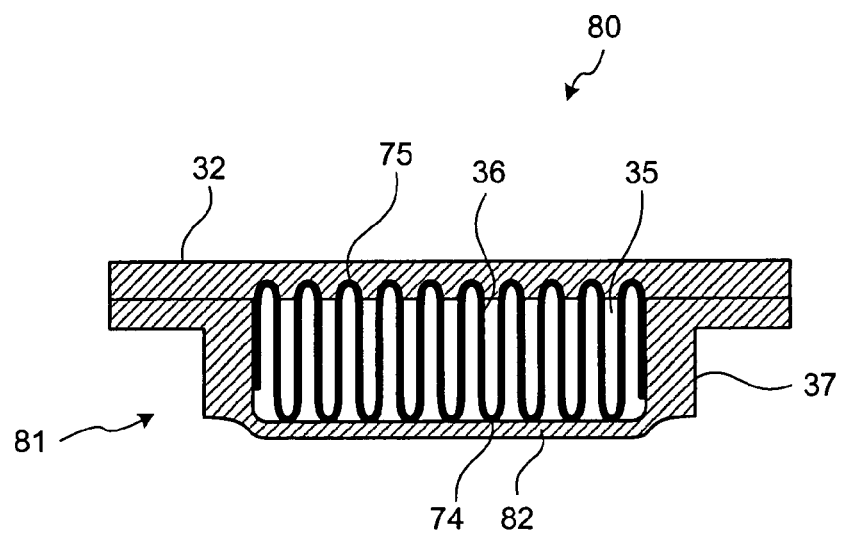
FIG. 33 illustrates a configuration where the second fold fits in the groove.
Figure 34:
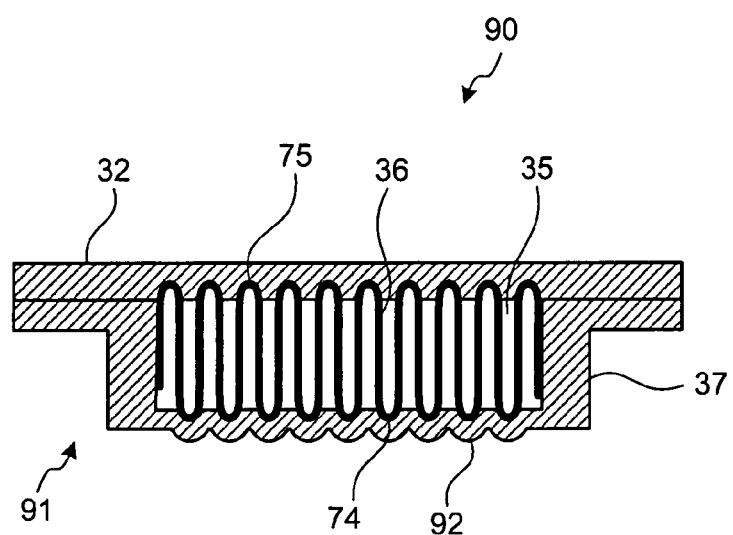
FIG. 34 illustrates the configuration where the second fold fits in the groove.
Figure 35:
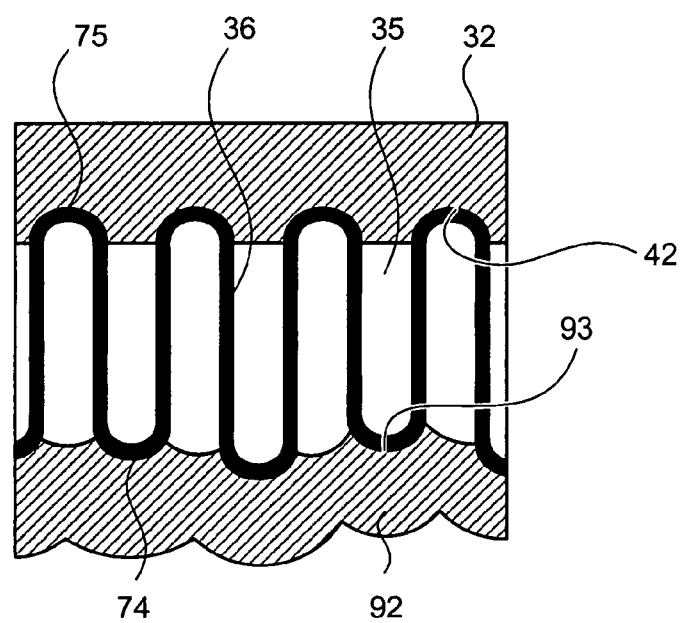
FIG. 35 illustrates the configuration where the second fold fits in the groove.

By surely pushing back the first fold 74 to the second structure 32 side, the second fold 75 can surely and directly contact the second structure 32 of flat plate shape even with the fluctuation in the length between the first fold 74 and the second fold 75. Thus, the heat exchange with still higher efficiency can be performed. The heat exchangers 80 and 90 may be provided with the groove on the second structure 32, similarly to the second embodiment. As shown in FIG. 33, the heat exchanger 80 can have a configuration that the second fold 75 fits in the groove of the second structure 32. As shown in FIGS. 34 and 35, the heat exchanger 90 can have the configuration that the second fold 75 fits in the groove 42 of the second structure 32. Furthermore, the heat exchanger according to the invention may be suitably formed in combination with any configuration according to the embodiments.

Figure 36:
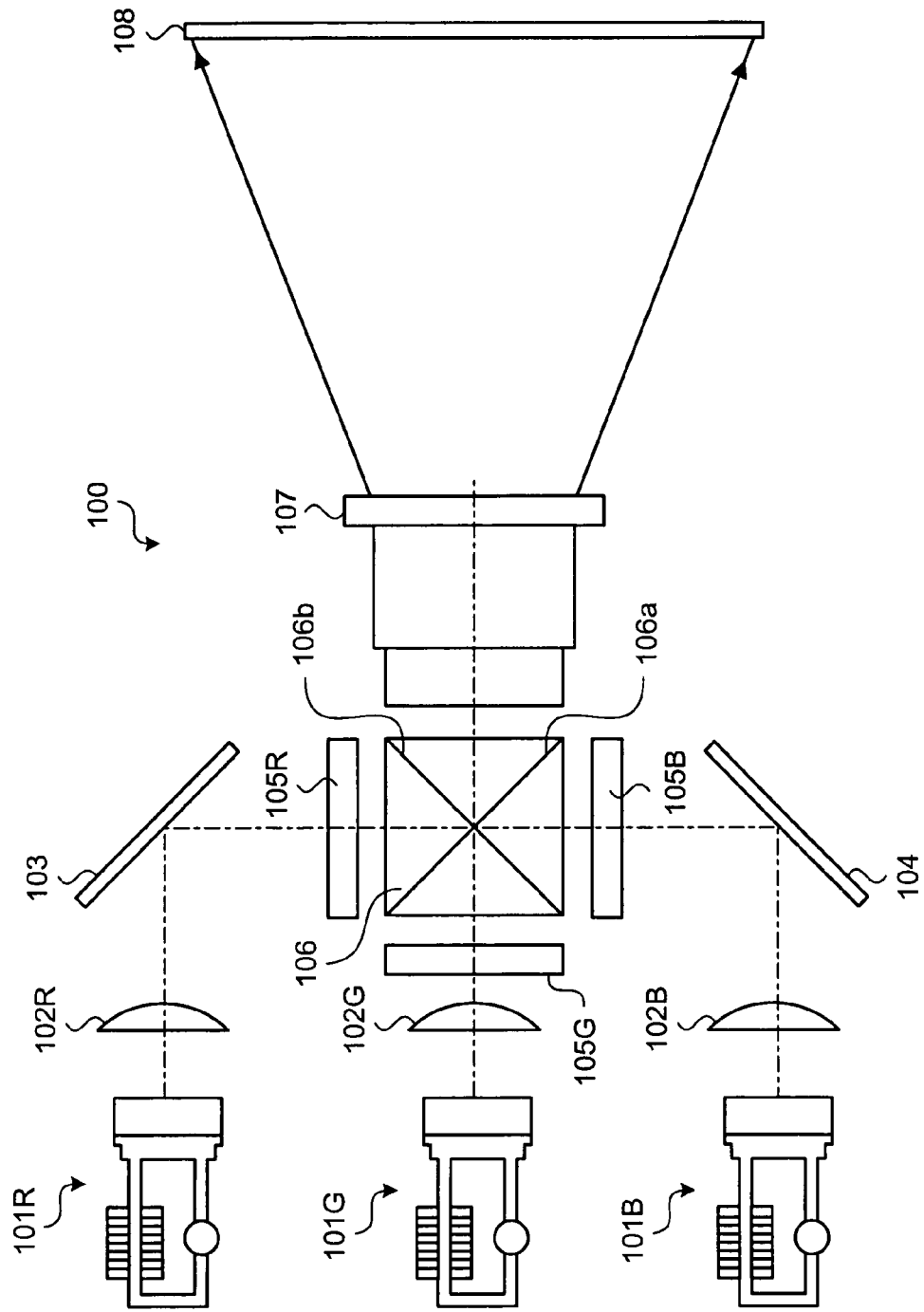
FIG. 36 is a schematic view of a configuration of a projector according to a sixth embodiment of the invention.

FIG. 36 is a schematic view of a configuration of a projector 100 according to a sixth embodiment of the invention. The projector 100 is a type of a front-projector which supplies a screen 108 with a light, and allows seeing an image by observing the light reflected by the screen 108. The projector 100 includes a light source apparatus for red light 101R, a light source apparatus for green light 101G, and a light source apparatus for blue light 101B. The light source apparatus for red light 101R supplies red light. The light source apparatus for green light 101G supplies green light. The light source apparatus for blue light 101B supplies blue light. Each of the light source apparatuses 101R, 101G, and 101B has the same configuration as the light source apparatus 10 of FIG. 1 according to the first embodiment. The light source apparatuses 101R, 101G, and 101B may be formed by using any heat exchanger in the embodiments.

A superposition lens 102R superposes a beam from the light source apparatus for red light 101R on a spatial light modulator for red light 105R. A reflection mirror 103 reflects the light from the superposition lens 102R in the direction of the spatial light modulator for red light 105R. The spatial light modulator for red light 105R is a transmission type of liquid crystal display device which modulates red light depending on an image signal. The red light modulated by the spatial light modulator for red light 105R enters a cross dichroic prism 106 serving as a color composition optical system.

A superposition lens 102G superposes a beam from the light source apparatus for green light 101G on a spatial light modulator for green light 105G. The spatial light modulator for green light 105G is the transmission type of liquid crystal display device which modulates green light depending on the image signal. The green light modulated by the spatial light modulator for green light 105G enters the cross dichroic prism 106.

A superposition lens 102B superposes a beam from the light source apparatus for blue light 101B on a spatial light modulator for blue light 105B. A reflection mirror 104 reflects the light from the superposition lens 102B in the direction of the spatial light modulator for blue light 105B. The spatial light modulator for blue light 105B is the transmission type of liquid crystal display device which modulates blue light depending on the image signal. The blue light modulated by the spatial light modulator for blue light 105B enters the cross dichroic prism 106. A homogenizing optical system which homogenizes an intensity distribution of the beam, such as a rod integrator and a fly's-eye lens may also be arranged in the projector 100.

The cross dichroic prism 106 has two dichroic films 106a and 106b which are disposed to be at right angles to each other. A first dichroic film 106a reflects the red light, and transmits the green light and the blue light. A second dichroic film 106b reflects the blue light, and transmits the red light and the green light. The cross dichroic prism 106 combines the red, green, and blue lights entering from different directions, and emits the combined light in the direction of a projection lens 107. The projection lens 107 projects the light from the cross dichroic prism 106 on the screen 108.

The projector 100 can be manufactured easily, and can project a clear image with a bright light by using the light source apparatuses 101R, 101G, and 101B which are the same as the light source apparatus 10. Thus, the invention has an advantage that a projector capable of projecting a clear image with a bright light can be easily manufactured. The light source apparatuses 101R, 101G, and 101B are not limited to a configuration that each apparatus has a circulation unit to circulate the refrigerant, and may have a configuration of using a common circulation unit. By connecting respective heat exchangers via the common circulation unit, the light source apparatuses 101R, 101G, and 101B can circulate the refrigerant by using the same circulation unit. When the common circulation is used, a circulation pump and a heat-radiation fin can be used in common. Thus, no necessity of providing the circulation pump and the heat-radiation fin for each of the light source apparatuses 101R, 101G, and 101B allows the projector 100 to have a reduced number of parts and a simple configuration.

The projector 100 is not limited to the configuration of providing three liquid crystal display devices of transmission type. For example, the projector 100 may have a configuration of using a reflective liquid crystal display device such as liquid crystal on silicon abbreviated to "LCOS", a configuration of using a minute-mirror-arrayed device, and a configuration of using a projection device such as a Grating Light Valve™ which controls a light direction, a color, and the likes by using a diffraction effect of the light. The projector is not limited to the front-projection type, and may be a rear-projection type which allows seeing an image by observing a light which has been projected on one surface of the screen and then emitted from the other surface of the screen.

As described above, the heat exchanger according to the invention is suitable for being used for a light source apparatus of a projector.

What is claimed is:

1. A heat exchanger, comprising:
a first structure and a second structure that form a fluid-flux portion for making a fluid flow, the second structure being provided on a heat source side with respect to the first structure; and
a corrugated plate stored in the fluid-flux portion, the second structure having a groove corresponding to a portion, of the corrugated plate, at a second structure side,
wherein the corrugated plate includes a fold formed on the second structure side, and a length in a depth direction of the groove is longer than a bending radius of an outer circumference of the fold and shorter than twice the bending radius, the bending radius being half the length of an outside diameter of the fold,
wherein the outside diameter of the fold is the distance from a first outer side of the corrugated plate at a point at which the fold begins to a second outer side of the corrugated plate at a point at which the fold ends, the first outer side being substantially parallel to the second outer side.

2. The heat exchanger according to claim 1, wherein the first structure includes a concave portion which is formed to store the corrugated plate therein.

3. The heat exchanger according to claim 1, wherein the first structure includes an inflow portion which makes the fluid flow into the fluid-flux portion, and an outflow portion which makes the fluid flow out of the fluid-flux portion.

4. The heat exchanger according to claim 3, wherein the corrugated plate is disposed between a joint portion with the inflow portion and a joint portion with the outflow portion in the fluid-flux portion.

5. The heat exchanger according to claim 1, wherein the first structure includes a notch portion which is formed to allow the corrugated plate on the first structure side to fit therein.

6. The heat exchanger according to claim 1, further comprising a caulking portion that joints the first structure and the second structure by caulking.

7. The heat exchanger according to claim 1, further comprising a pressing member, wherein
the corrugated plate includes a first fold formed on the first structure side, and a second fold formed on the second structure side, and the pressing member is provided between the first fold and the first structure, and makes the second fold press against the second structure.

8. The heat exchanger according to claim 1, further comprising a press-deformation portion that is formed by making at least a portion corresponding to the corrugated plate in the first structure deformed accordingly while the corrugated plate is depressed.

9. The heat exchanger according to claim 1, wherein the groove is formed to allow the corrugated plate on the second structure side to fit therein via an interference fit.

10. The heat exchanger according to claim 1, further comprising a filling member that is provided between the first structure and the corrugated plate.

11. The heat exchanger according to claim 1, further comprising a pressing member, wherein
the corrugated plate includes a first fold formed on the first structure side, and a second fold formed on the second structure side, and
the pressing member is provided between the first fold and the first structure, and makes the second fold press against the second structure.

12. The heat exchanger according to claim 1, wherein
the corrugated plate includes a plurality of folds formed on a second structure side, each of the folds being disposed in a corresponding groove of the second structure, and
the folds are disposed in the grooves at varying depths.

13. A light source apparatus, comprising:
a light source unit that supplies a light; and
a heat exchanger that radiates a heat of the light source unit, wherein
the heat exchanger includes
a first structure and a second structure that form a fluid-flux portion for making a fluid flow, the second structure being provided on a heat source side with respect to the first structure; and
a corrugated plate stored in the fluid-flux portion, the second structure having a groove corresponding to a portion, of the corrugated plate, at a second structure side, and
the corrugated plate includes a fold formed on the second structure side, and a length in a depth direction of the groove is longer than a bending radius of an outer circumference of the fold, and shorter than twice the bending radius, the bending radius being half the length of an outside diameter of the fold,
wherein the outside diameter of the fold is the distance from a first outer side of the corrugated plate at a point at which the fold begins to a second outer side of the corrugated plate at a point at which the fold ends, the first outer side being substantially parallel to the second outer side.

14. The light source apparatus according to claim 13, the corrugated plate including a plurality of folds formed on a second structure side, each of the folds being disposed in a corresponding groove of the second structure, and
the folds are disposed in the grooves at varying depths.

15. A projector, comprising
a light source apparatus that includes a light source unit which supplies a light, and a heat exchanger which radiates a heat of the light source unit, wherein
the heat exchanger includes
a first structure and a second structure that form a fluid-flux portion for making a fluid flow, the second structure being provided on a heat source side with respect to the first structure; and
a corrugated plate stored in the fluid-flux portion, the second structure having a groove corresponding to a portion, of the corrugated plate, at a second structure side, and
the corrugated plate includes a fold formed on the second structure side, and a length in a depth direction of the groove is longer than a bending radius of an outer circumference of the fold, and shorter than twice the bending radius, the bending radius being half an outside diameter of the fold,
wherein the outside diameter of the fold is the distance from a first outer side of the corrugated plate at a point at which the fold begins to a second outer side of the corrugated plate at a point at which the fold ends, the first outer side being substantially parallel to the second outer side.

16. The projector according to claim 15, the corrugated plate including a plurality of folds formed on a second structure side, each of the folds being disposed in a corresponding groove of the second structure, and
the folds are disposed in the grooves at varying depths.

* * * * *